US010512153B2

(12) United States Patent
Ishibashi et al.

(10) Patent No.: US 10,512,153 B2
(45) Date of Patent: Dec. 17, 2019

(54) HIGH FREQUENCY CIRCUIT

(71) Applicant: MITSUBISHI ELECTRIC CORPORATION, Tokyo (JP)

(72) Inventors: Hidenori Ishibashi, Tokyo (JP); Kiyoshi Ishida, Tokyo (JP); Eigo Kuwata, Tokyo (JP); Yukinobu Tarui, Tokyo (JP); Hideharu Yoshioka, Tokyo (JP); Hiroyuki Aoyama, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/091,467

(22) PCT Filed: Apr. 27, 2016

(86) PCT No.: PCT/JP2016/063211
§ 371 (c)(1),
(2) Date: Oct. 4, 2018

(87) PCT Pub. No.: WO2017/187559
PCT Pub. Date: Nov. 2, 2017

(65) Prior Publication Data
US 2019/0159332 A1    May 23, 2019

(51) Int. Cl.
*H05K 1/02* (2006.01)
*H01L 23/66* (2006.01)
*H05K 1/18* (2006.01)

(52) U.S. Cl.
CPC ............ *H05K 1/021* (2013.01); *H01L 23/66* (2013.01); *H05K 1/0206* (2013.01); *H05K 1/0209* (2013.01); *H05K 1/0274* (2013.01); *H05K 1/181* (2013.01); *H05K 2201/10121* (2013.01)

(58) Field of Classification Search
CPC .... H05K 1/021; H05K 1/0206; H05K 1/0209; H05K 1/0274; H05K 1/181; H01L 23/66
USPC .......................................................... 174/252
See application file for complete search history.

(56) References Cited

U.S. PATENT DOCUMENTS

2009/0091904 A1    4/2009  Hatanaka et al.
2012/0293977 A1   11/2012  Sun

FOREIGN PATENT DOCUMENTS

| JP | 2000-195988 A | 7/2000 |
| JP | 2000-299427 A | 10/2000 |
| JP | 2003-60523 A | 2/2003 |
| JP | 2005-26373 A | 1/2005 |
| JP | 2007-294828 A | 11/2007 |

(Continued)

OTHER PUBLICATIONS

International Search Report, issued in PCT/JP2016/063211, PCT/ISA/210, dated Jun. 21, 2016.

(Continued)

*Primary Examiner* — Tremesha S Willis
(74) *Attorney, Agent, or Firm* — Birch, Stewart, Kolasch & Birch, LLP

(57) ABSTRACT

A printed wiring board includes conductor layers, a core layer having an opening, and a build-up layer. A high frequency device placed within the opening is installed such that a mirror surface is thermally connected to a conductor layer for heat dissipation facing the opening from a lower surface side of the core layer, and terminals on the terminal surface are electrically connected to conductor layers formed on an upper surface side of the core layer.

11 Claims, 9 Drawing Sheets

(56) References Cited

FOREIGN PATENT DOCUMENTS

| JP | 2011-181970 A | 9/2011 |
|----|---------------|--------|
| JP | 2011-187812 A | 9/2011 |
| JP | 2012-238797 A | 12/2012 |
| JP | 2012-244166 A | 12/2012 |

OTHER PUBLICATIONS

Notification of Reasons for Refusal for Japanese Application No. 2016-555844, dated Mar. 21, 2017.
Notification of Reasons for Refusal for Japanese Application No. 2016-555844, dated Nov. 8, 2016.

HIGH FREQUENCY CIRCUIT

TECHNICAL FIELD

The present disclosure relates to a high frequency circuit on which a high frequency device used for, for example, communication equipment, is installed.

BACKGROUND ART

Generally, a transmission/reception unit of a high frequency circuit used for communication equipment includes a high output amplifier, a low noise amplifier, a mixer, and an oscillator. Since the high output amplifier used as the transmission/reception unit is a device having a large calorific value, it is required to take measures for dissipating heat.

For example, in a semiconductor device described in Patent Literature 1 below, heat of the device is dissipated by disposing a plate-shaped lead on a device having a large calorific value.

In addition, conventionally, in order to realize a transmission/reception unit with a small size and a small loss of input/output signals for a high frequency circuit, it is required to shorten wiring between devices.

For example, in a multilayer circuit module described in Patent Literature 2, wiring is shortened by disposing high frequency devices in an inner layer of a multilayer substrate while vertically connecting the wiring of the devices.

CITATION LIST

Patent Literature 1: JP 2011-181970 A
Patent Literature 2: JP 2012-238797 A

SUMMARY OF INVENTION

However, in the semiconductor device described in Patent Literature 1, a plurality of devices is disposed in a planar direction of a substrate. Such structure may cause is a problem that a connection between the devices becomes longer and the size becomes larger. In addition, a loss of input/output signals becomes larger as wiring of the connection is longer.

On the other hand, the multilayer circuit module described in Patent Literature 2 has structure with a small size, and is capable of reducing a loss of input/output signals. However, since the heat dissipation is not taken in the multilayer circuit module, there may be concern that performance of the devices deteriorates due to heat.

The present disclosure has been made to solve the above problems. An object of the present disclosure is to obtain a high frequency circuit having a small size, capable of reducing a loss of input and output signals, and capable of realizing high heat dissipation characteristics.

A high frequency circuit according to the present disclosure is provided with a substrate and a first high frequency device and a second high frequency device.

The substrate includes: a first dielectric layer having an opening which penetrates the first dielectric layer in a layer thickness direction; second dielectric layers laminated on a lower surface and an upper surface of the first dielectric layer, and a plurality of conductor layers provided in the first dielectric layer and the second dielectric layer.

The first high frequency device is placed within the opening, the first high frequency device being installed such that: a device back surface opposite a terminal surface is thermally and closely connected to a conductor layer for heat dissipation out of the plurality of conductor layers, the conductor layer for heat dissipation provided at the lower surface side of the first dielectric layer; and a terminal on the terminal surface is electrically connected to a terminal conductor layer out of the plurality of conductor layers through a first via hole provided in the second dielectric layer, the terminal conductor layer being formed on said another surface side of the first dielectric layer. The second high frequency device (11) is installed such that a terminal surface thereof faces a surface layer of the upper surface side of the first dielectric layer in the substrate and that terminals on the terminal surface are electrically connected to terminal conductor layers.

In the structure above, the first/second high frequency devices are disposed at different positions in a planar direction on the substrate (2), and, in each of the first/second high frequency devices, signal terminals are separated by a ground terminal.

According to the present disclosure, the terminal of the first high frequency device built in the substrate is connected to the conductor layer with a short wiring distance. Therefore, a circuit having a small size can be realized, and a loss of input and output signal can be reduced. Furthermore, since the device back surface of the first high frequency device is thermally connected to the conductor layer for heat dissipation, high heat dissipation characteristics can be realized.

DESCRIPTION OF EMBODIMENTS

Hereinafter, in order to describe the present disclosure in more detail, embodiments for carrying out the present disclosure will be described with reference to the attached drawings.

Embodiment 1

Figure 1:
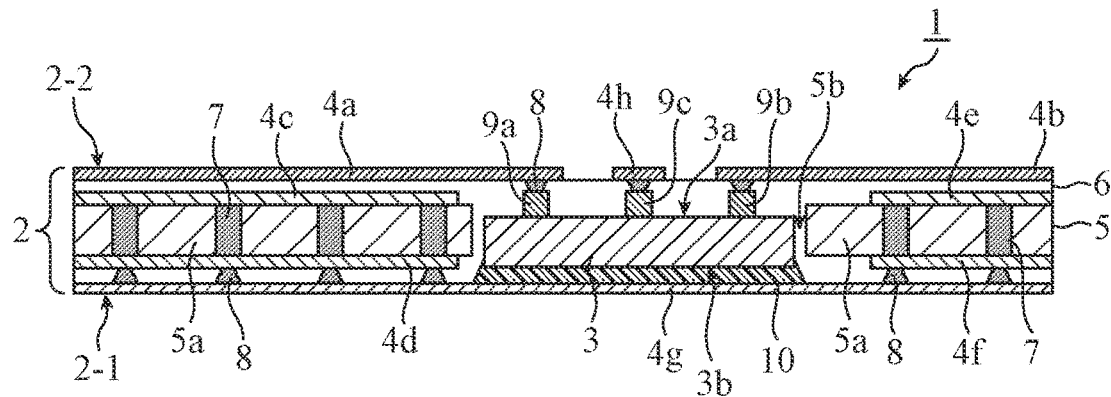
FIG. 1 is a cross-sectional view illustrating structure of a high frequency circuit according to Embodiment 1 of the present disclosure.

FIG. 1 is a cross-sectional view illustrating structure of a high frequency circuit 1 according to Embodiment 1 of the present disclosure. As illustrated in FIG. 1, the high frequency circuit 1 includes a printed wiring board 2 and a high frequency device 3.

The printed wiring board 2 is a substrate constituting the high frequency circuit 1, and includes conductor layers 4a to 4h, a core layer 5, and a build-up layer 6. The conductor layers 4a to 4h are conductor layers formed in the core layer 5 and the build-up layer 6.

In addition, the high frequency device 3 embodies a first high frequency device in the present disclosure. The high frequency device 3 is realized by, for example, a semiconductor chip which has a terminal surface 3a as one surface and a mirror surface 3b as another surface. The terminal surface 3a is a surface on which a terminal of the high frequency device 3 is installed. The mirror surface 3b, on which no terminal is formed, is a device back surface opposite the terminal surface 3a.

The conductor layer 4g embodies a conductor layer for heat dissipation in the present disclosure, which has a ground potential. The conductor layer 4g is formed on one surface 2-1 of the printed wiring board 2 and faces an opening 5b from a lower surface side of the core layer 5.

That is, the conductor layer 4g is formed in the build-up layer 6 as a lowermost layer of the printed wiring board 2. One surface of the conductor layer 4g faces the outside, and another surface thereof faces the opening 5b.

Hereinafter, the conductor layer having a ground potential may be described as a ground conductor or a ground conductor layer, and a conductor layer for propagating a signal may be described as a signal conductor or a signal conductor layer.

It is better to provide the conductor layer for heat dissipation by the conductor layer 4g with one surface facing the outside of the printed wiring board 2, as illustrated in FIG. 1. However, alternatively, a ground conductor layer formed in an inner layer of the build-up layer 6 may be used for the conductor layer for heat dissipation. In this case, the conductor layer for heat dissipation has a multilayer structure in which a ground conductor layer facing the outside of the printed wiring board 2 is connected to the ground conductor layer in an inner layer of the build-up layer 6 through a via hole serving as a heat dissipation path.

Each of the conductor layers 4a, 4b, and 4h embodies a terminal conductor layer in the present disclosure. Each layer is realized by a conductor layer formed on another surface 2-2 of the printed wiring board 2 and is electrically connected to a terminal of the high frequency device 3.

Here, the conductor layer 4h is a ground conductor layer formed on another surface 2-2 of the printed wiring board 2. As illustrated in FIG. 1, the conductor layers 4a and 4b are signal conductor layers formed on the surface 2-2 of the printed wiring board 2, and a signal is propagated through the conductor layers 4a and 4b.

The conductor layers 4c to 4f are ground conductor layers formed in the core layer 5.

The core layer 5 embodies a first dielectric layer in the present disclosure. The core layer 5 is laminated to sandwich an insulating layer 5a with the conductor layers 4c to 4f. The core layer 5 has the opening 5b penetrating the core layer 5 in a layer thickness direction.

The conductor layer 4c is electrically connected to the conductor layer 4d through a via hole 7 formed in the core layer 5, and the conductor layer 4d is electrically connected to the conductor layer 4g through a via hole 8 formed in the build-up layer 6. Similarly, the conductor layer 4e is electrically connected to the conductor layer 4f through the via hole 7, and the conductor layer 4f is electrically connected to the conductor layer 4g through the via hole 8.

The build-up layer 6 embodies a second dielectric layer in the present disclosure. The build-up layer 6 is laminated on each of one surface (lower surface) of the core layer 5 orthogonal to a layer thickness direction and another surface (upper surface) of the core layer 5 orthogonal to the layer thickness direction. Note that the build-up layer 6 and the via hole 8 are laminated by, for example, a build-up method.

The high frequency device 3 is placed within the opening 5b of the core layer 5 such that the terminal surface 3a faces upward. The mirror surface 3b of the high frequency device 3 is bonded to the conductor layer 4g with an adhesive 10. By closely fixing the mirror surface 3b to a surface of the conductor layer 4g, the mirror surface 3b is thermally connected to the conductor layer 4g. It is desirable that the adhesive 10 has high thermal conductivity.

In order to thermally connect the mirror surface 3b to the conductor layer 4g, besides the adhesive 10, the high frequency device 3 may be molded with resin while the mirror surface 3b and the conductor layer 4g are in contact with each other.

A signal terminal 9a on the terminal surface 3a is electrically connected to the conductor layer 4a through the via hole 8 of the build-up layer 6. A signal terminal 9b of the terminal surface 3a is electrically connected to the conductor layer 4b through the via hole 8. The conductor layers 4a and 4b are signal conductor layers as described above.

A ground terminal 9c on the terminal surface 3a is electrically connected to the conductor layer 4h through the via hole 8. The conductor layer 4h is a ground conductor layer as described above.

Next, operation will be described.

A signal input to the conductor layer 4a is input to the high frequency device 3 through the via hole 8 and the signal terminal 9a. As a result, the high frequency device 3 processes the signal.

A signal processed by the high frequency device 3 is output from the conductor layer 4b through the signal terminal 9b and the via hole 8. Heat generated during that time in the high frequency device 3 is dissipated from the mirror surface 3b to the outside through the adhesive 10 and the conductor layer 4g.

As described above, the high frequency circuit 1 according to the Embodiment 1 includes the printed wiring board 2 and the high frequency device 3.

The printed wiring board 2 includes the conductor layers 4a to 4h, the core layer 5 having the opening 5b penetrating the core layer 5 in a layer thickness direction, and the build-up layers 6 laminated on upper and lower surfaces of the core layer 5.

The mirror surface 3b of the high frequency device 3, which is placed within the opening 5b of the core layer 5, is thermally connected to the conductor layer 4g for heat dissipation facing the opening 5b from a lower surface side of the core layer 5 among the conductor layers 4a to 4h. The terminals 9a and 9b on the terminal surface 3a are electrically connected to the terminal conductor layers 4a, 4b, and 4h formed on an upper surface side of the core layer 5.

Since the high frequency device 3 is built in the printed wiring board 2 in this manner, the high frequency circuit 1 can be reduced in height, and a circuit having a small size can be realized.

In addition, since terminals are connected to each other with a short wiring distance through the via holes 8 formed in the build-up layer 6, a loss of input and output signals can be reduced.

Furthermore, the mirror surface 3b of the high frequency device 3 is thermally connected to the conductor layer 4g. Therefore, high heat dissipation characteristics can be realized because a space of interposing a material having low thermal conductivity is narrowed.

Embodiment 2

Figure 2:
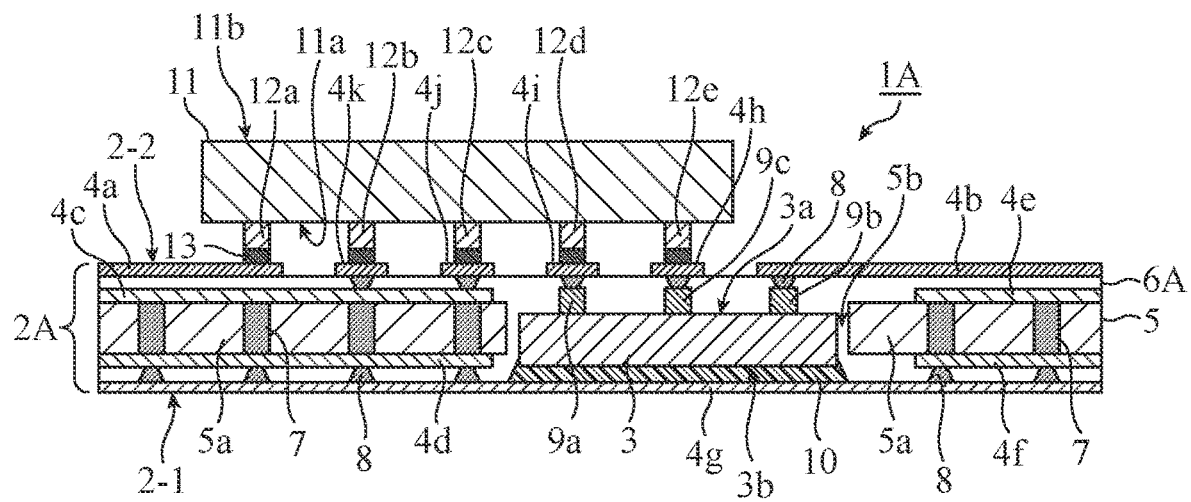
FIG. 2 is a cross-sectional view illustrating structure of a high frequency circuit according to Embodiment 2 of the present disclosure.

FIG. 2 is a cross-sectional view illustrating structure of a high frequency circuit 1A according to Embodiment 2 of the present disclosure. In FIG. 2, the same components as those in FIG. 1 are denoted by the same reference numerals, and description thereof is omitted.

As illustrated in FIG. 2, the high frequency circuit 1A includes a printed wiring board 2A, a high frequency device 3, and a high frequency device 11. The printed wiring board 2A is a substrate constituting the high frequency circuit 1A, and includes conductor layers 4a to 4k, a core layer 5, and a build-up layer 6A. In addition, the conductor layers 4a to 4k are conductor layers formed in the core layer 5 and the build-up layer 6A.

The high frequency device 11 embodies a second high frequency device in the present disclosure. The high frequency device 11 is realized by, for example, a semiconductor chip having a terminal surface 11a as one surface and a mirror surface 11b as another surface. The terminal surface 11a is a surface on which a terminal of the high frequency device 11 is installed. The mirror surface 11b is a device back surface opposite the terminal surface 11a, on which no terminal is formed.

As described in the foregoing Embodiment 1, the conductor layer 4g is a conductor layer for heat dissipation formed on one surface 2-1 of the printed wiring board 2A and facing an opening 5b from a lower surface side of the core layer 5.

The conductor layers 4h, 4j, and 4k are ground conductor layers formed on another surface 2-2 of the printed wiring board 2A. In the high frequency circuit 1A, the conductor layers 4a, 4b, and 4i are terminal conductor layers.

The build-up layer 6A embodies a second dielectric layer in the present disclosure. The build-up layer 6A is laminated on each of an upper surface of the core layer 5 orthogonal to a layer thickness direction and a lower surface of the core layer 5 orthogonal to the layer thickness direction. Note that the build-up layer 6A and a via hole 8 are laminated by, for example, a build-up method.

The high frequency device 11 is installed such that the terminal surface 11a facing another surface 2-2 of the printed wiring board 2A. On the terminal surface 11a, a signal terminal 12a is electrically connected to the conductor layer 4a with solder 13, and a signal terminal 12d is electrically connected to the conductor layer 4i with solder 13. Note that the conductor layers 4a and 4i are signal conductor layers.

On the terminal surface 11a, a ground terminal 12b is electrically connected to the conductor layer 4k with solder 13, and a ground terminal 12c is electrically connected to the conductor layer 4j with solder 13.

A ground terminal 12e on the terminal surface 11a is electrically connected to the conductor layer 4h with solder 13. Note that the conductor layers 4k, 4j, and 4h are ground conductor layers.

The conductor layers 4j and 4k are electrically connected to the conductor layer 4c of the core layer 5 through the via hole 8 of the build-up layer 6A. The conductor layer 4h is electrically connected to a ground terminal 9c of the high frequency device 3 through the via hole 8. In addition, the conductor layer 4i is electrically connected to a signal terminal 9a through the via hole 8.

Next, operation will be described.

A signal input to the conductor layer 4a is input to the high frequency device 11 through solder 13 and the signal terminal 12a. As a result, the high frequency device 11 processes the signal.

A signal processed by the high frequency device 11 is input to the high frequency device 3 through the signal terminal 12d, solder 13, the conductor layer 4i, the via hole 8, and the signal terminal 9a. As a result, the high frequency device 3 processes the signal.

A signal processed by the high frequency device 3 is output from the conductor layer 4b through the signal terminal 9b and the via hole 8. Heat generated during that time in the high frequency device 3 is dissipated from the mirror surface 3b to the outside through the adhesive 10 and the conductor layer 4g.

Figure 3:
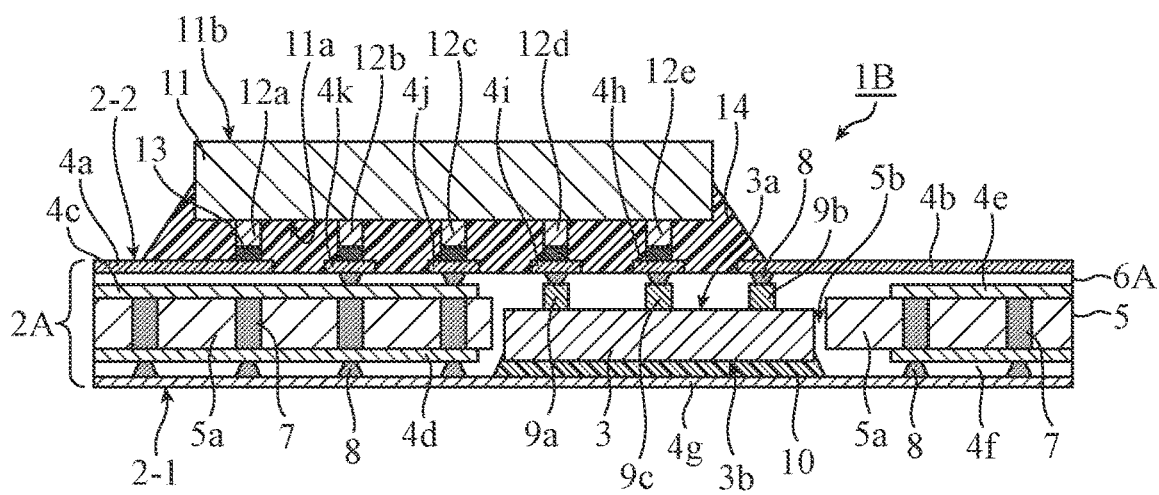
FIG. 3 is a cross-sectional view illustrating a modified example of the high frequency circuit according to the Embodiment 2.

In FIG. 2, the high frequency device 11 is connected to the printed wiring board 2A only with solder 13. Alternatively, as in a high frequency circuit 1B illustrated in FIG. 3, the high frequency device 11 may be further fixed by filling an under space thereof with an underfill 14.

In addition, the high frequency device 11 may be connected to the printed wiring board 2A with an anisotropic conductive adhesive instead of solder 13, and an insulating adhesive may be used as the underfill 14.

As described above, each of the high frequency circuits 1A and 1B according to the Embodiment 2 includes the high frequency device 11, which is installed such that the terminal surface 11a faces another surface 2-2 of the printed wiring board 2A.

As illustrated in FIG. 2, the high frequency device 11 is installed above the high frequency device 3. Therefore, a loss of input and output signals can be reduced because a wiring length between the high frequency device 3 and the high frequency device 11 is shortened.

In addition, since the high frequency device 3 is built in the printed wiring board 2A, a circuit having a small size can be realized even using a plurality of high frequency devices.

Furthermore, as in the foregoing Embodiment 1, the mirror surface 3b of the high frequency device 3 is thermally connected to the conductor layer 4g for heat dissipation. Therefore, high heat dissipation characteristics can be realized because a space of interposing a material having low thermal conductivity is narrowed.

Embodiment 3

Figure 4:
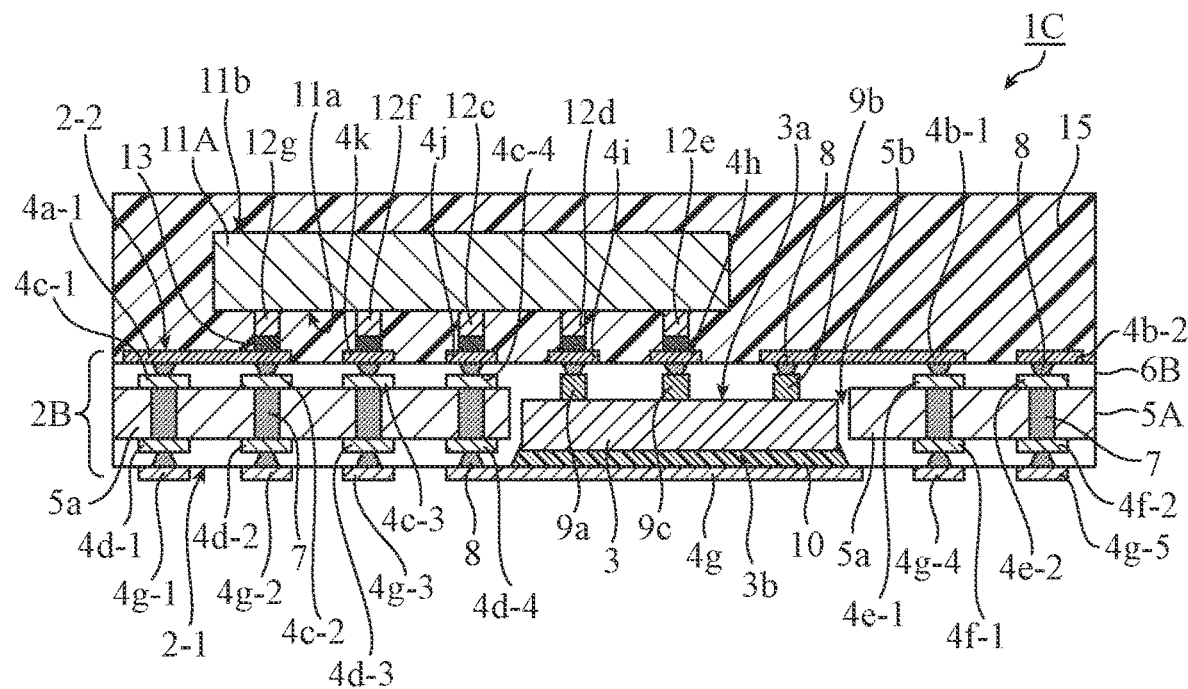
FIG. 4 is a cross-sectional view illustrating structure of a high frequency circuit according to Embodiment 3 of the present disclosure.

FIG. 4 is a cross-sectional view illustrating structure of a high frequency circuit 1C according to Embodiment 3 of the present disclosure.

In FIG. 4, the same components as those in FIGS. 1 and 2 are denoted by the same reference numerals, and description thereof is omitted. The high frequency circuit 1C includes a printed wiring board 2B, a high frequency device 3, and a high frequency device 11A. As illustrated in FIG. 4, a surface 2-2 of the printed wiring board 2B including the high frequency device 11A is molded with resin 15.

The printed wiring board 2B includes conductor layers 4a-1, 4b-1, 4b-2, 4c-1 to 4c-4, 4d-1 to 4d-4, 4e-1, 4e-2, 4f-1, 4f-2, 4g, 4g-1 to 4g-5, 4h to 4k, a core layer 5A, and a build-up layer 6B.

The conductive layers 4a-1, 4b-1, 4b-2, 4c-1 to 4c-4, 4d-1 to 4d-4, 4e-1, 4e-2, 4f-1, 4f-2, 4g, 4g-1 to 4g-5, and 4h to 4k are conductor layers formed in the core layer 5A and the build-up layer 6B.

As described in the foregoing Embodiment 1, the conductor layer 4g is a conductor layer for heat dissipation formed on a surface 2-1 of the printed wiring board 2B. The conductor layers 4a-1, 4b-2, 4c-1, 4c-2, 4c-4, 4d-1, 4d-2, 4d-4, 4e-2, 4f-2, 4g, 4g-1, 4g-2, 4g-5, 4h, and 4j are ground conductor layers. The conductor layers 4c-3, 4d-3, 4g-3, 4g-4, 4i, 4b-1, 4e-1, 4f-1, and 4k are signal conductor layers.

The conductor layers 4c-1 to 4c-4 are electrically connected to the conductor layers 4d-1 to 4d-4 through a via hole 7 formed in the core layer 5A. The conductor layer 4d-4 is electrically connected to the conductor layer 4g through a via hole 8 formed in the build-up layer 6B.

Similarly, the conductor layers 4e-1 and 4e-2 are electrically connected to the conductor layers 4f-1 and 4f-2 through the via hole 7. The conductor layers 4f-1 and 4f-2 are electrically connected to the conductor layers 4g-4 and 4g-5 through the via hole 8.

The core layer 5A embodies a first dielectric layer in the present disclosure. The core layer 5A is laminated to sandwich an insulating layer 5a with the conductor layers 4c-1 to 4c-4, 4d-1 to 4d-4, 4e-1, 4e-2, 4f-1, and 4f-2. The core layer 5A has an opening 5b penetrating the core layer 5A in a layer thickness direction.

The build-up layer 6B embodies a second dielectric layer in the present disclosure. The build-up layer 6B is laminated on each of an upper surface of the core layer 5A orthogonal to a layer thickness direction and a lower surface of the core layer 5A orthogonal to the layer thickness direction.

Note that the build-up layer 6B and the via hole 8 are laminated by, for example, a build-up method.

The high frequency device 11A embodies a second high frequency device in the present disclosure. The high frequency device 11A is installed such that a terminal surface 11a faces the surface 2-2 of the printed wiring board 2B.

On the terminal surface 11a, a signal terminal 12f is electrically connected with solder 13 to the conductor layer 4k being a signal conductor, and a signal terminal 12d is electrically connected with solder 13 to the conductor layer 4i being a signal conductor.

On the terminal surface 11a, a ground terminal 12g is electrically connected with solder 13 to the conductor layer 4a-1 being a ground conductor layer, and a ground terminal 12c is electrically connected with solder 13 to the conductor layer 4j being a ground conductor. In addition, a ground terminal 12e is electrically connected with solder 13 to the conductor layer 4h being a ground conductor.

Next, operation will be described.

A signal input to the conductor layer 4g-3 is input to the core layer 5A through the via hole 8 and the conductor layer 4d-3, and, after that, input to the high frequency device 11A through the via hole 7, the conductor layer 4c-3, the via hole 8, the conductor layer 4k, solder 13, and the signal terminal 12f. As a result, the high frequency device 11A processes the signal.

A signal processed by the high frequency device 11A is input to the high frequency device 3 through the signal terminal 12d, solder 13, the conductor layer 4i, the via hole 8, and the signal terminal 9a. As a result, the high frequency device 3 processes the signal.

A signal processed by the high frequency device 3 is input to the core layer 5A through the signal terminal 9b, the via hole 8, the conductor layer 4b-1, the via hole 8, and the conductor layer 4e-1, and output from the conductor layer 4g-4 through the via hole 7, the conductor layer 4f-1, and the via hole 8.

Heat generated during that time in the high frequency device 3 is dissipated from the mirror surface 3b to the outside through the adhesive 10 and the conductor layer 4g.

In the high frequency circuit 1C, the high frequency device 11A may be fixed by filling an under space thereof with an underfill 14 before being molded with resin 15.

In addition, the high frequency device 11A may be connected to the printed wiring board 2B with an anisotropic conductive adhesive instead of solder 13, and an insulating adhesive may be used as the underfill 14.

Figure 5:
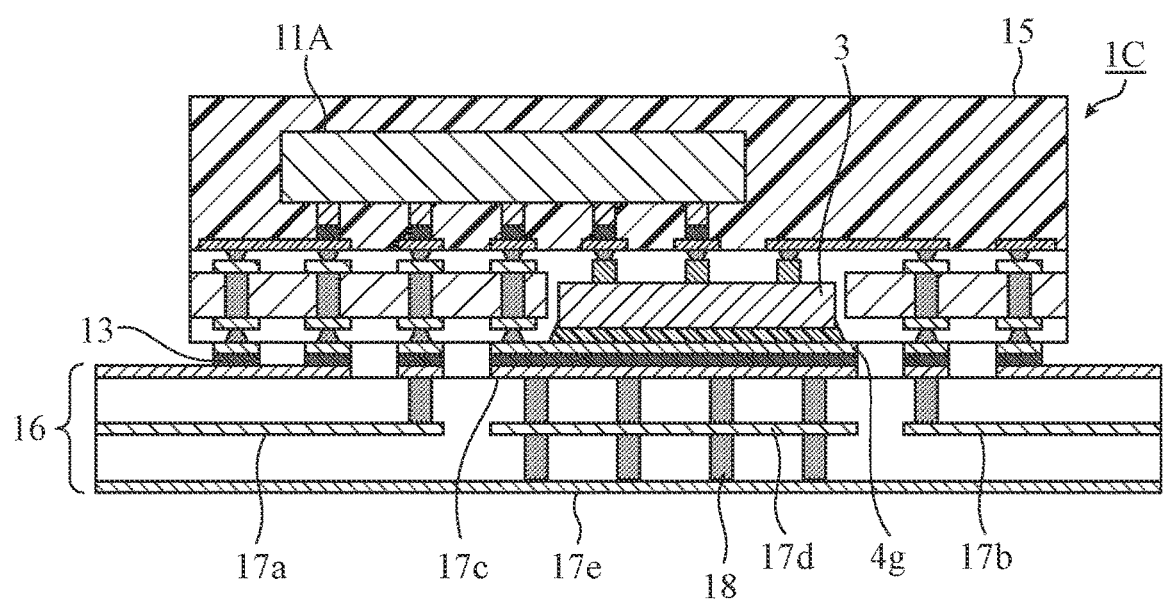
FIG. 5 is a cross-sectional view illustrating a modified example of the high frequency circuit according to the Embodiment 3.

Furthermore, as illustrated in FIG. 5, the high frequency circuit 1C may be installed on a mother board 16.

In FIG. 5, conductor layers 17a and 17b provided in the mother board 16 are signal conductor layers, and are connected to the high frequency circuit 1C through a via hole 18.

In addition, conductor layers 17c, 17d, and 17e provided in the mother board 16 are ground conductor layers, and are connected to one another through a plurality of via holes 18 penetrating the mother board 16 in a layer thickness direction.

Those via holes 18 serve as heat dissipation paths.

Heat generated in the high frequency device 3 is transferred to the conductor layer 17c of the mother board 16 through the conductor layer 4g and solder 13, and, after that, dissipated from the conductor layer 17e through the conductor layer 17d and the via holes 18 formed above and below the conductor layer 17d. Therefore, in the high frequency circuit 1C illustrated in FIG. 5, a conductor layer for heat dissipation is formed by the conductor layer 4g, solder 13, the conductor layers 17c to 17e, and the via hole 18.

Figure 6:
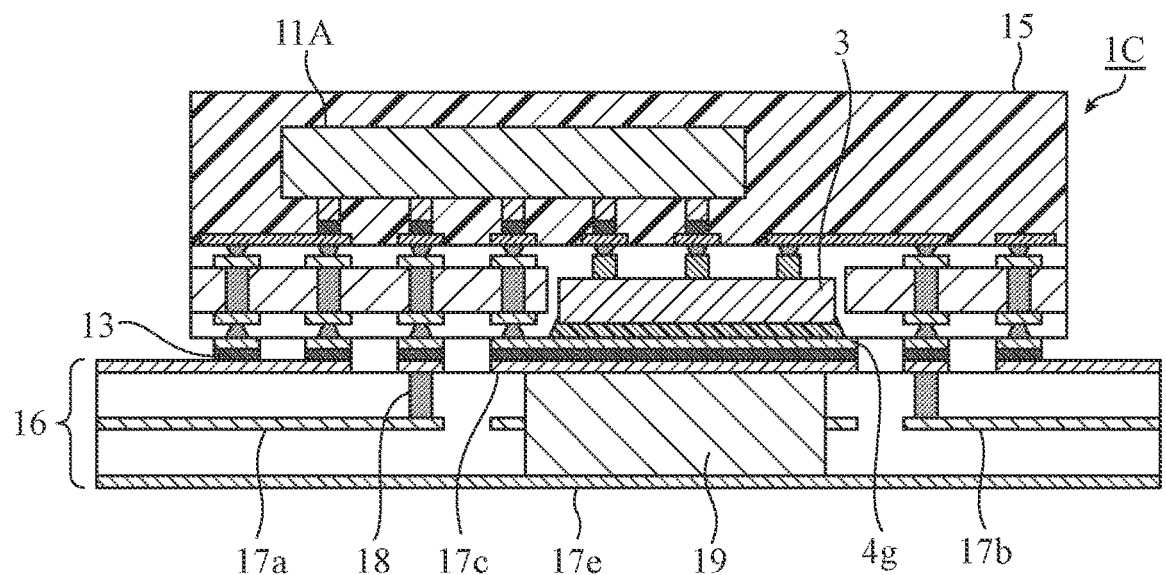
FIG. 6 is a cross-sectional view illustrating another modified example of the high frequency circuit according to the Embodiment 3.

Alternatively, as illustrated in FIG. 6, a metal block 19 may be provided between the conductor layer 17c and the conductor layer 17e in the mother board 16. In this structure, the metal block 19 is in contact with the conductor layers 17c and 17e. As a result, heat generated in the high frequency device 3 is dissipated from the conductor layer 17e through the conductor layer 17c and the metal block 19.

Therefore, in the high frequency circuit 1C illustrated in FIG. 6, a conductor layer for heat dissipation is formed by the conductor layer 4g, solder 13, the conductor layer 17c, the metal block 19, and the conductor layer 17e.

Although the high frequency device 11A is molded with the resin 15, the Embodiment 3 may be applied to the structure described in the foregoing Embodiment 2.

That is, in the high frequency circuits 1A and 1B according to the Embodiment 2, the high frequency device 11 may be molded with the resin 15. Even with such structure, an effect similar to the above can be obtained.

As described above, in the high frequency circuit 1C according to the Embodiment 3, the high frequency device 11A is molded with the resin 15. With such structure, in addition to the effect described in the Embodiment 2, reliability of mounting is improved by molding with the resin 15.

In addition, since the high frequency circuit 1C has structure, in which a signal is transmitted toward the surface 2-1 of the printed wiring board 2B, the high frequency circuit 1C can be used as a surface mounting package.

Embodiment 4

Figure 7:
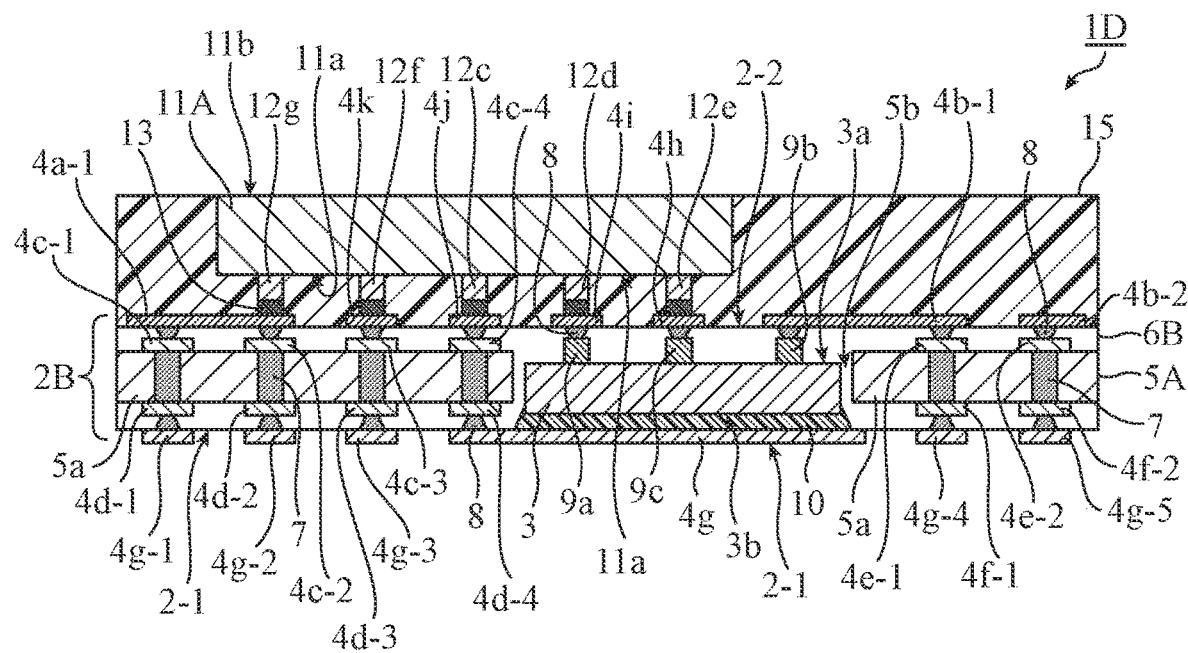
FIG. 7 is a cross-sectional view illustrating structure of a high frequency circuit according to Embodiment 4 of the present disclosure.

FIG. 7 is a cross-sectional view illustrating structure of a high frequency circuit 1D according to Embodiment 4 of the present disclosure.

In FIG. 7, the same components as those in FIGS. 1, 2, and 4 are denoted by the same reference numerals, and description thereof is omitted. The high frequency circuit 1D includes a printed wiring board 2B, a high frequency device 3, and a high frequency device 11A. A surface 2-2 of the printed wiring board 2B including the high frequency device 11A is molded with resin 15.

In the high frequency device 11A in the high frequency circuit 1D, a mirror surface 11b is exposed from the resin 15 as illustrated in FIG. 7. Specifically, in the high frequency circuit 1D, the resin 15 is molded up to a height equal to or lower than that of the mirror surface 11b in a thickness direction of the high frequency device 11A. According to this structure, the high frequency circuit 1D is thinner than the high frequency circuit 1C illustrated in FIG. 5.

The high frequency circuit 1D operates similarly to the high frequency circuit 1C described in the foregoing Embodiment 3. During this operation, heat generated in the high frequency device 3 is dissipated from a conductor layer 4g to the outside through a mirror surface 3b and an adhesive 10. Heat generated in the high frequency device 11A is dissipated from the mirror surface 11b to the outside.

In the high frequency circuit 1D, the high frequency device 11A may be fixed by filling an under space thereof with an underfill 14 before being molded with resin 15.

In addition, the high frequency device 11A may be connected to the printed wiring board 2B with an anisotropic conductive adhesive instead of solder 13, and an insulating adhesive may be used as the underfill 14.

Furthermore, the high frequency circuit 1D may be mounted on the mother board 16 illustrated in FIGS. 5 and 6.

Although the high frequency device 11A is molded with the resin 15, the Embodiment 4 may be applied to the structure described in the foregoing Embodiment 2. That is, in the high frequency circuits 1A and 1B according to the Embodiment 2, molding may be performed with the resin 15 to expose the mirror surface 11b of the high frequency device 11.

As described above, in the high frequency circuit 1D according to the Embodiment 4, the mirror surface 11b of the high frequency device 11A is exposed from the resin 15.

With such structure, there is an effect that a thin circuit can be realized in addition to the effect described in the foregoing Embodiment 3. In addition, since heat generated in the high frequency device 11A is dissipated from the mirror surface 11b exposed to the outside, the property of heat dissipation is improved.

Embodiment 5

Figure 8:
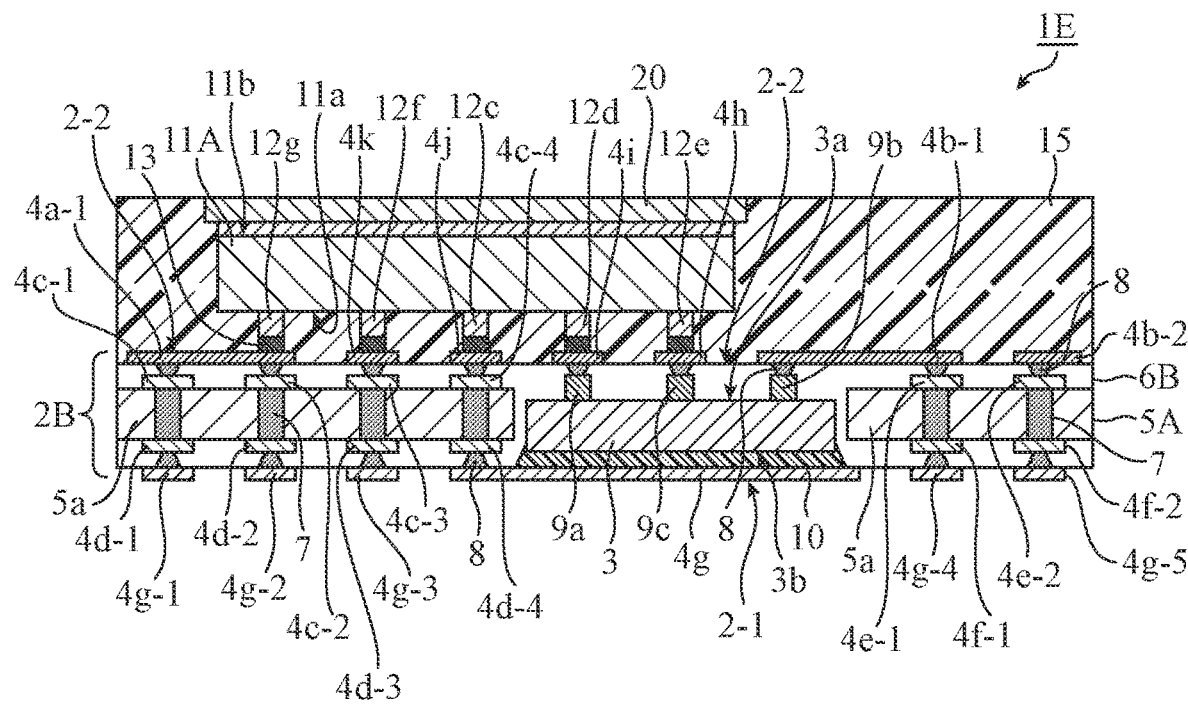
FIG. 8 is a cross-sectional view illustrating structure of a high frequency circuit according to Embodiment 5 of the present disclosure.

FIG. 8 is a cross-sectional view illustrating structure of a high frequency circuit 1E according to Embodiment 5 of the present disclosure.

In FIG. 8, the same components as those in FIGS. 1, 2, and 4 are denoted by the same reference numerals, and description thereof is omitted. The high frequency circuit 1E includes a printed wiring board 2B, a high frequency device 3, and a high frequency device 11A. A surface 2-2 of the printed wiring board 2B including the high frequency device 11A is molded with resin 15.

As illustrated in FIG. 8, in the high frequency device 11A of the high frequency circuit 1E, a metal plate 20 is connected to a mirror surface 11b with an adhesive 10a. It is desirable that the adhesive 10a has high thermal conductivity like the adhesive 10.

The metal plate 20 is exposed from the resin 15 to the outside. Specifically, in the high frequency circuit 1E, the resin 15 is molded up to a height equal to or lower than that of a surface of the metal plate 20 in a thickness direction of the high frequency device 11A. As a result, the high frequency circuit 1E has substantially the same thickness as the high frequency circuit 1D, and is thinner than the high frequency circuit 1C illustrated in FIG. 5.

The high frequency circuit 1E operates similarly to the high frequency circuit 1C described in the foregoing Embodiment 3. In this operation, heat generated in the high frequency device 3 is dissipated from a mirror surface 3b to the outside through the adhesive 10 and a conductor layer 4g. In addition, heat generated in the high frequency device 11A is dissipated from the mirror surface 11b to the outside through the adhesive 10a and the metal plate 20.

In the high frequency circuit 1E, the high frequency device 11A may be fixed by filling an under space thereof with an underfill 14 before being molded with resin 15.

In addition, the high frequency device 11A may be connected to the printed wiring board 2B with an anisotropic conductive adhesive instead of solder 13, and an insulating adhesive may be used as the underfill 14.

Furthermore, as illustrated in FIGS. 5 and 6, the high frequency circuit 1E may be installed on a mother board 16.

Although the high frequency device 11A is molded with the resin 15, the Embodiment 5 may be applied to the structure described in the foregoing Embodiment 2.

Specifically, in the high frequency circuits 1A and 1B according to the Embodiment 2, the metal plate 20 may be connected to the mirror surface 11b of the high frequency device 11, and the molding with the resin 15 may be performed to expose the metal plate 20. Even with such structure, an effect similar to the above can be obtained.

As described above, the high frequency circuit 1E according to the Embodiment 5 includes the metal plate 20 connected to the mirror surface 11b of the high frequency device 11A, and the metal plate 20 is exposed from the resin 15. With such structure, in addition to the effect described in the Embodiment 3, a thin circuit can be realized. In addition, since heat generated in the high frequency device 11A is dissipated from the metal plate 20, the property of heat dissipation is improved.

Embodiment 6

Figure 9:
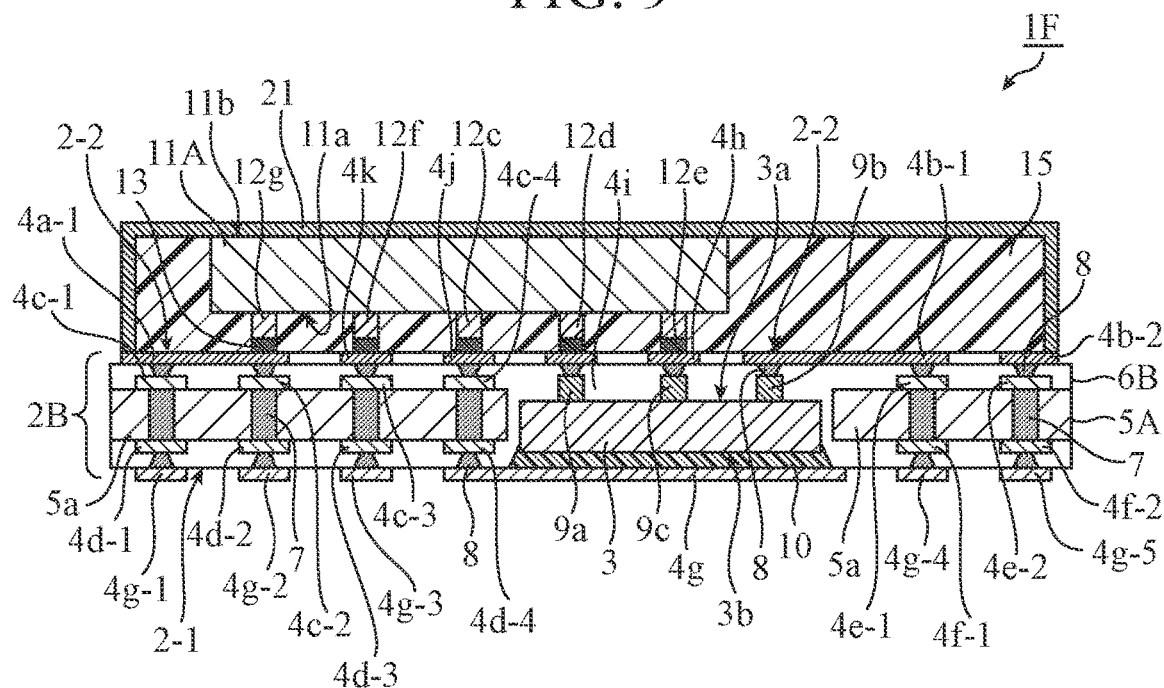
FIG. 9 is a cross-sectional view illustrating structure of a high frequency circuit according to Embodiment 6 of the present disclosure.

FIG. 9 is a cross-sectional view illustrating structure of a high frequency circuit 1F according to Embodiment 6 of the present disclosure.

In FIG. 9, the same components as those in FIGS. 1, 2, and 4 are denoted by the same reference numerals, and description thereof is omitted. The high frequency circuit 1F includes a printed wiring board 2B, a high frequency device 3, and a high frequency device 11A. A surface 2-2 of the printed wiring board 2B including the high frequency device 11A is molded with resin 15. In the Embodiment 6, a shield 21 is provided on a mirror surface 11b of the high frequency device 11A in the high frequency circuit 1F, as illustrated in FIG. 9.

The shield 21 embodies a first shield in the present disclosure. The shield 21 covers the mirror surface 11b of the high frequency device 11A and a surface of the resin 15 provided around the mirror surface 11b. The shield 21 is formed by, for example, performing metal-plating on the mirror surface 11b and the surface of the resin 15. Alternatively, a conductive thin film obtained by printing, spraying, or sealing a conductive material on the mirror surface 11b and the surface of the resin 15 may be provided as the shield 21.

The shield 21 is electrically connected to a ground conductor layer of the printed wiring board 2B.

As illustrated in FIG. 9, the shield 21 covers a side of the surface 2-2 of the printed wiring board 2B while being in contact with conductor layers 4a-1 and 4b-2 of a ground conductor.

A method for forming the shield 21 while electrically connecting to the ground conductor layer will be described.

Figure 10:
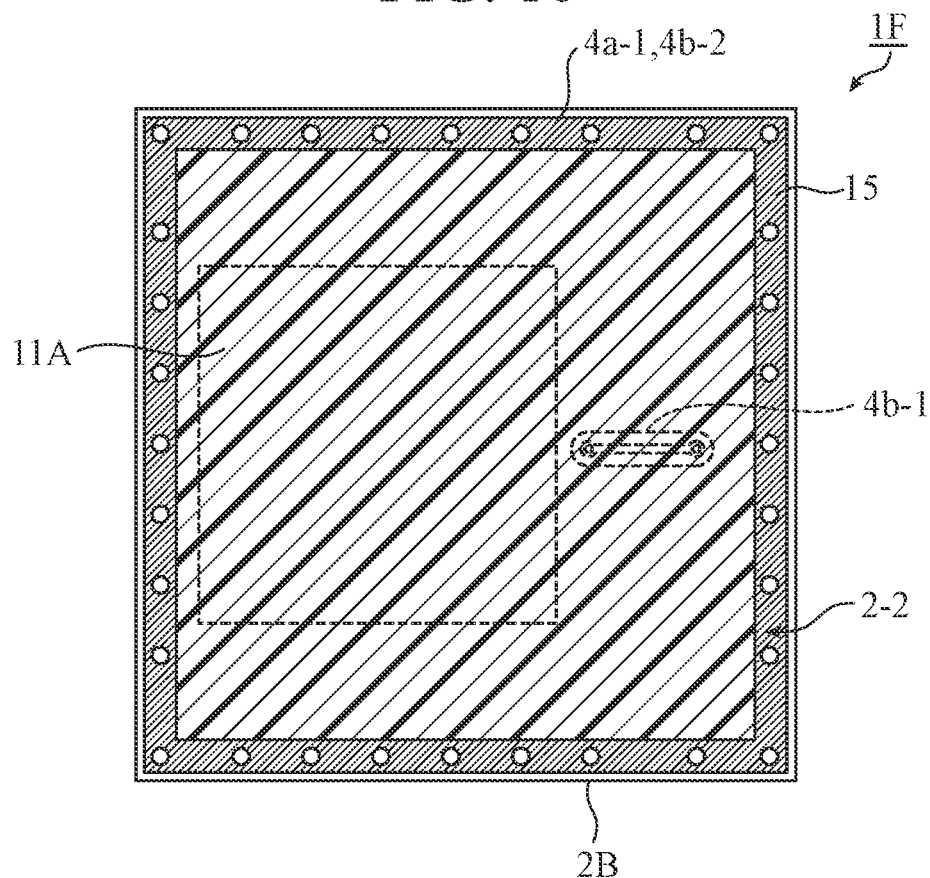
FIG. 10 is a top view illustrating the high frequency circuit according to the Embodiment 6.

FIG. 10 is a top view illustrating the high frequency circuit 1F, in which the high frequency device 11A and a conductor layer 4b-1 covered with the resin 15 are represented by broken lines.

First, on the surface 2-2 of the printed wiring board 2B, an area including the high frequency device 11A and the conductor layer 4b-1 and being surrounded by the conductor layers 4a-1 and 4b-2 is molded with the resin 15, as illustrated in FIG. 10. After molding with the resin 15 in this manner, the shield 21 is formed by performing metal-plating on the surface 2-2 of the printed wiring board 2B. As a result, the shield 21 is also formed on the conductor layers 4a-1 and 4b-2, and the shield 21 is electrically connected to the conductor layers 4a-1 and 4b-2.

The high frequency circuit 1F operates similarly to the high frequency circuit 1C described in the foregoing Embodiment 3. In this operation, heat generated in the high frequency device 3 is dissipated from a mirror surface 3b to the outside through the adhesive 10 and a conductor layer 4g. In addition, heat generated in the high frequency device 11A is dissipated from the mirror surface 11b through the shield 21. When a signal is propagated in the high frequency circuit 1F, one surface of the high frequency circuit 1F is covered with the shield 21 having a ground potential. Therefore, an unnecessary electromagnetic wave is hardly radiated to the outside of the high frequency circuit 1F.

In the high frequency circuit 1F, the high frequency device 11A may be fixed by filling an under space thereof with an underfill 14 before being molded with resin 15.

In addition, the high frequency device 11A may be connected to the printed wiring board 2B with an anisotropic conductive adhesive instead of solder 13, and an insulating adhesive may be used as the underfill 14.

Figure 11:
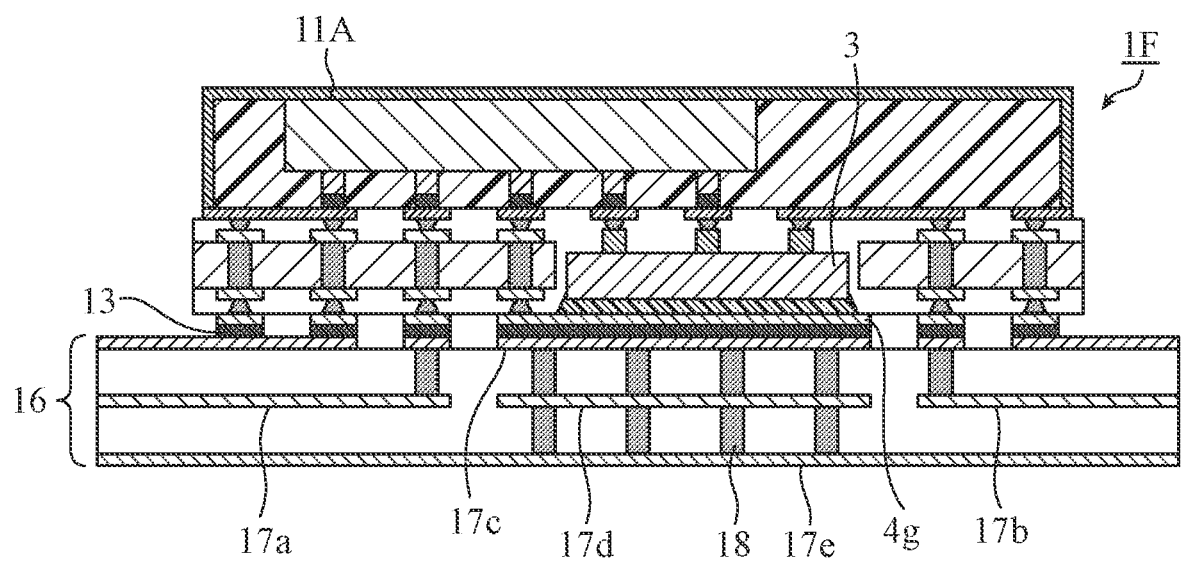
FIG. 11 is a cross-sectional view illustrating a modified example of the high frequency circuit according to the Embodiment 6.

Furthermore, as illustrated in FIG. 11, the high frequency circuit 1F may be installed on a mother board 16.

Conductor layers 17a and 17b provided on the mother board 16 are connected to the high frequency circuit 1F through a via hole 18. The conductor layer 4g of the high frequency circuit 1F is connected to a conductor layer 17c of the mother board 16 with solder 13. The conductor layer 17c is connected to conductor layers 17d and 17e through a plurality of the via holes 18.

Heat generated in the high frequency device 3 is transferred to the conductor layer 17c of the mother board 16 through the conductor layer 4g and solder 13, and is further dissipated from the conductor layer 17e through the conductor layer 17d and the via holes 18 formed above and below the conductor layer 17d.

Therefore, in the high frequency circuit 1F illustrated in FIG. 11, a conductor layer for heat dissipation is formed by the conductor layer 4g, solder 13, the conductor layers 17c to 17e, and the via hole 18.

The high frequency circuit 1F may be installed on the mother board 16 in which the metal block 19 illustrated in FIG. 6 is provided.

Although the high frequency device 11A is molded with the resin 15, the Embodiment 6 may be applied to the structure disclosed in the foregoing Embodiment 2.

Specifically, in the high frequency circuits 1A and 1B according to the Embodiment 2, the molding may be performed with the resin 15 to expose the mirror surface 11b of the high frequency device 11. The mirror surface 11b and the surface 2-2 including a surface of the resin 15 around the mirror surface 11b may be covered with the shield 21. Even with such structure, an effect similar to the above can be obtained.

Figure 12:
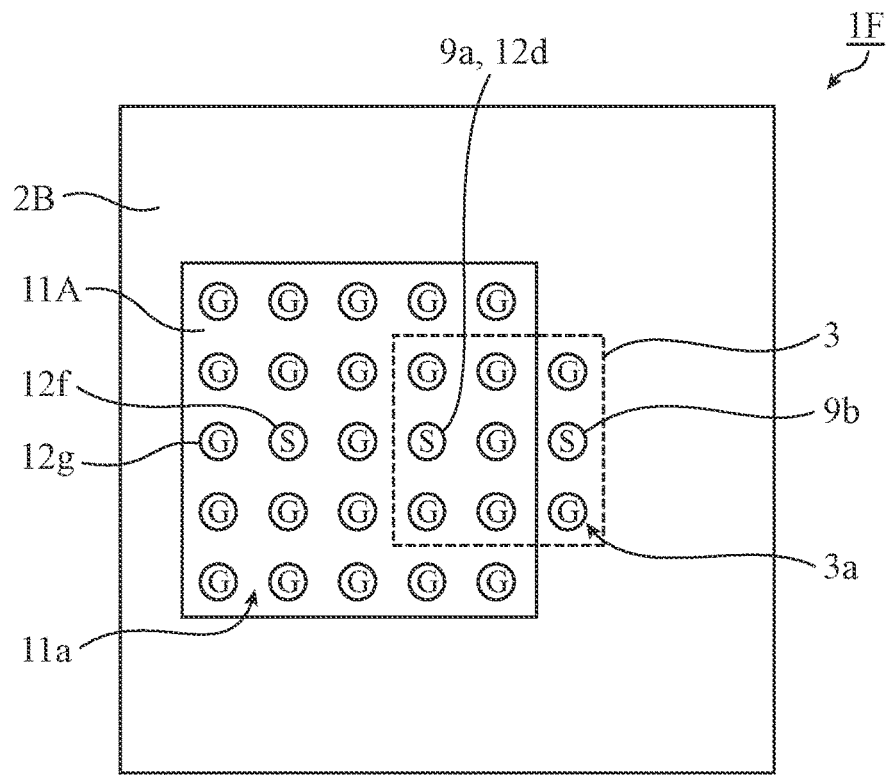
FIG. 12 is a top view illustrating an arrangement of terminals in a high frequency device.

FIG. 12 is a top view illustrating an arrangement of terminals in the high frequency devices 3 and 11A. In FIG. 12, in order to visually represent the arrangement of the terminals, representations other than the outer shape of the high frequency device 11A and the terminals are illustrated transparently. Here, a circle surrounding a letter "S" indicates a signal terminal, and a circle surrounding a letter "G" indicates a ground terminal.

As illustrated in FIG. 12, on the terminal surface 3a of the high frequency device 3 and the terminal surface 11a of the high frequency device 11A, ground terminals are arranged around a signal terminal.

The ground terminals are arranged at intervals designed to reduce leakage of a high frequency signal in a usable frequency band of the high frequency circuit 1F. For example, the ground terminals are arranged at intervals that are capable of making a cutoff frequency higher than that in the usable frequency band. With such structure, it is possible to reduce leakage of an unnecessary high frequency signal to elements other than a signal path passing through a signal terminal.

In FIG. 12, the ground terminals are arranged around a signal terminal on both the terminal surface 3a of the high frequency device 3 and the terminal surface 11a of the high frequency device 11A. Alternatively, the ground terminals may be arranged around a signal terminal on either the terminal surface 3a or the terminal surface 11a.

In addition, the arrangement where ground terminals are arranged around a signal terminal may be applied to the high frequency device 3 included in the high frequency circuit 1 according to the foregoing Embodiment 1. Even with such structure, an effect similar to the above can be obtained.

As described above, the high frequency circuit 1F according to the Embodiment 6 includes the shield 21 that covers the mirror surface 11b of the high frequency device 11A and the resin 15 and is electrically connected to the conductor layers 4a-1 and 4b-2 of a ground conductor.

With such structure, in addition to the effect described in the Embodiment 4, an unnecessary electromagnetic wave is hardly radiated to the outside of the high frequency circuit 1F by providing the shield 21.

In addition, in the high frequency circuit 1F according to the Embodiment 6, on the terminal surface 3a of the high frequency device 3 and/or the terminal surface 11a of the high frequency device 11A, the ground terminals are arranged around a signal terminal at intervals designed to reduce leakage of a high frequency signal in the usable frequency band.

With such structure, it is possible to reduce leakage of an unnecessary high frequency signal to elements other than a signal path passing through a signal terminal.

Embodiment 7

Figure 13:
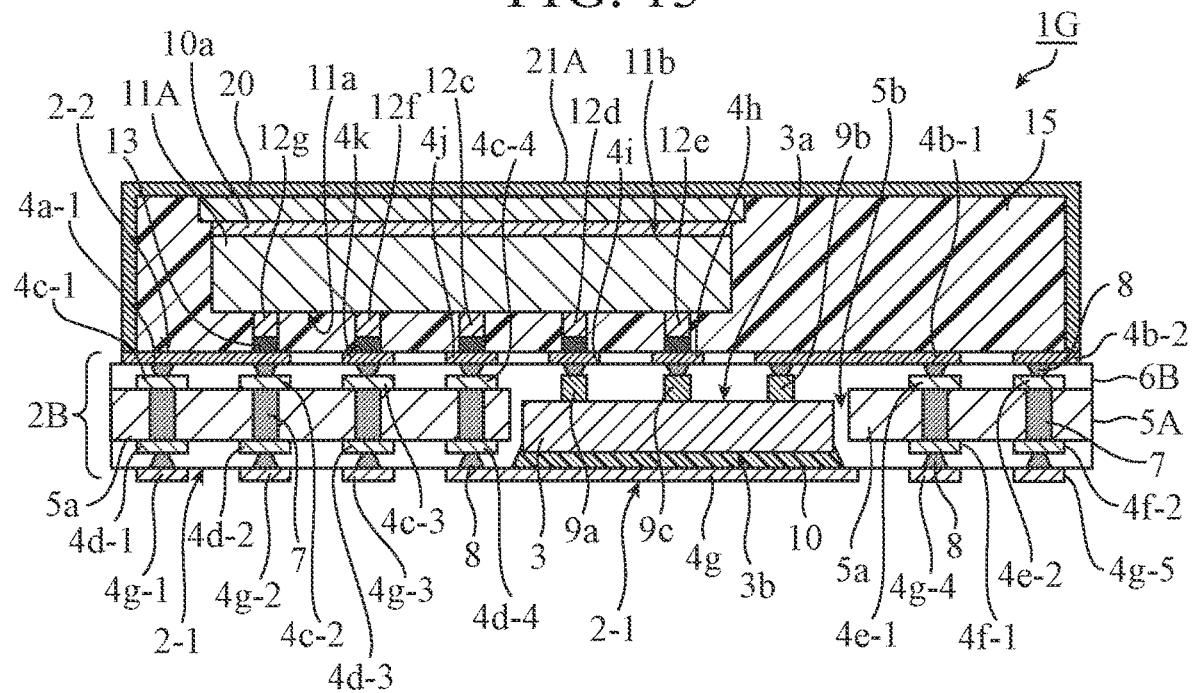
FIG. 13 is a cross-sectional view illustrating structure of a high frequency circuit according to Embodiment 7 of the present disclosure.

FIG. 13 is a cross-sectional view illustrating structure of a high frequency circuit 1G according to Embodiment 7 of the present disclosure. In FIG. 13, the same components as those in FIGS. 1, 2, and 4 are denoted by the same reference numerals, and description thereof is omitted. The high frequency circuit 1G includes a printed wiring board 2B, a high frequency device 3, and a high frequency device 11A. A surface 2-2 of the printed wiring board 2B including the high frequency device 11A is molded with resin 15.

As illustrated in FIG. 13, in the high frequency device 11A of the high frequency circuit 1G, a metal plate 20 is bonded to a mirror surface 11b with an adhesive 10a.

By closely fixing the mirror surface 11b and the metal plate 20 with each other, the mirror surface 11b is thermally connected to the metal plate 20.

Note that the adhesive 10a is desirably an adhesive having high thermal conductivity like the adhesive 10.

The metal plate 20 is exposed from the resin 15 covering the high frequency device 11A. The the entire surface 2-2 including an exposed part of the metal plate 20 and the resin 15 provided around the metal plate 20 are covered with a shield 21A.

Specifically, in the high frequency circuit 1G, the resin 15 is molded up to a height equal to or lower than that of a surface of the metal plate 20 in a thickness direction of the high frequency device 11A.

As a result, the high frequency circuit 1G has substantially the same thickness as the high frequency circuit 1E illustrated in FIG. 8, and is slightly thinner than the high frequency circuit 1C illustrated in FIG. 5.

The shield 21A embodies a second shield in the present disclosure. The shield 21A covers a side of the surface 2-2 of the printed wiring board 2B while contacting conductor layers 4a-1 and 4b-2. The shield 21A is formed by, for example, performing metal-plating on the mirror surface 11b of the high frequency device 11A and a surface of the resin 15 like the foregoing shield 21. Alternatively, a conductive thin film, which is obtained by printing, spraying, or sealing a conductive material on the mirror surface 11b of the high frequency device 11A and the surface of the resin 15, may be used as the shield 21A.

The high frequency circuit 1G operates similarly to the high frequency circuit 1C described in the foregoing Embodiment 3. In this operation, heat generated in the high frequency device 3 is dissipated from a mirror surface 3b to the outside through the adhesive 10 and a conductor layer 4g.

In addition, heat generated in the high frequency device 11A is dissipated from the mirror surface 11b to the outside through the adhesive 10a, the metal plate 20 and the shield 21.

Furthermore, when a signal is propagated in the high frequency circuit 1G, since one surface of the high frequency circuit 1G is covered with the shield 21A having a ground potential, an unnecessary electromagnetic wave is hardly radiated to the outside of the high frequency circuit 1G.

In the high frequency circuit 1G, the high frequency device 11A may be fixed by filling an under space thereof with an underfill 14 before being molded with resin 15.

In addition, the high frequency device 11A may be connected to the printed wiring board 2B with an anisotropic conductive adhesive instead of solder 13, and an insulating adhesive may be used as the underfill 14.

Furthermore, the high frequency circuit 1G may be installed on the mother board 16 illustrated in FIGS. 5 and 6.

The structure in which the high frequency device 11A is molded with the resin 15 has been illustrated, and the Embodiment 7 may be applied to the structure described in the foregoing Embodiment 2.

Specifically, in the high frequency circuits 1A and 1B according to the Embodiment 2, the metal plate 20 may be connected to the mirror surface 11b of the high frequency device 11, the molding may be performed with the resin 15 to expose the metal plate 20, and the shield 21 may be provided on a surface of the molded product. Even with such structure, an effect similar to the above can be obtained.

Furthermore, at least on either the terminal surface 3a of the high frequency device 3 or the terminal surface 11a of the high frequency device 11A, ground terminals may be arranged around a signal terminal at intervals that are designed to prevent leakage of a high frequency signal in a usable frequency band of the high frequency circuit 1G. As a result, it is possible to reduce leakage of an unnecessary high frequency signal to elements other than a signal path passing through a signal terminal.

As described above, the high frequency circuit 1G according to the Embodiment 7 includes the shield 21A covering the metal plate 20 and the resin 15 and is electrically connected to the conductor layers 4a-1 and 4b-2, each having a ground potential. With this structure, since the metal plate 20 having a low thermal resistance is provided near the high frequency device 11A, there is an effect that the property of heat dissipation is improved in addition to the effect described in the foregoing Embodiment 6.

Embodiment 8

Figure 14:
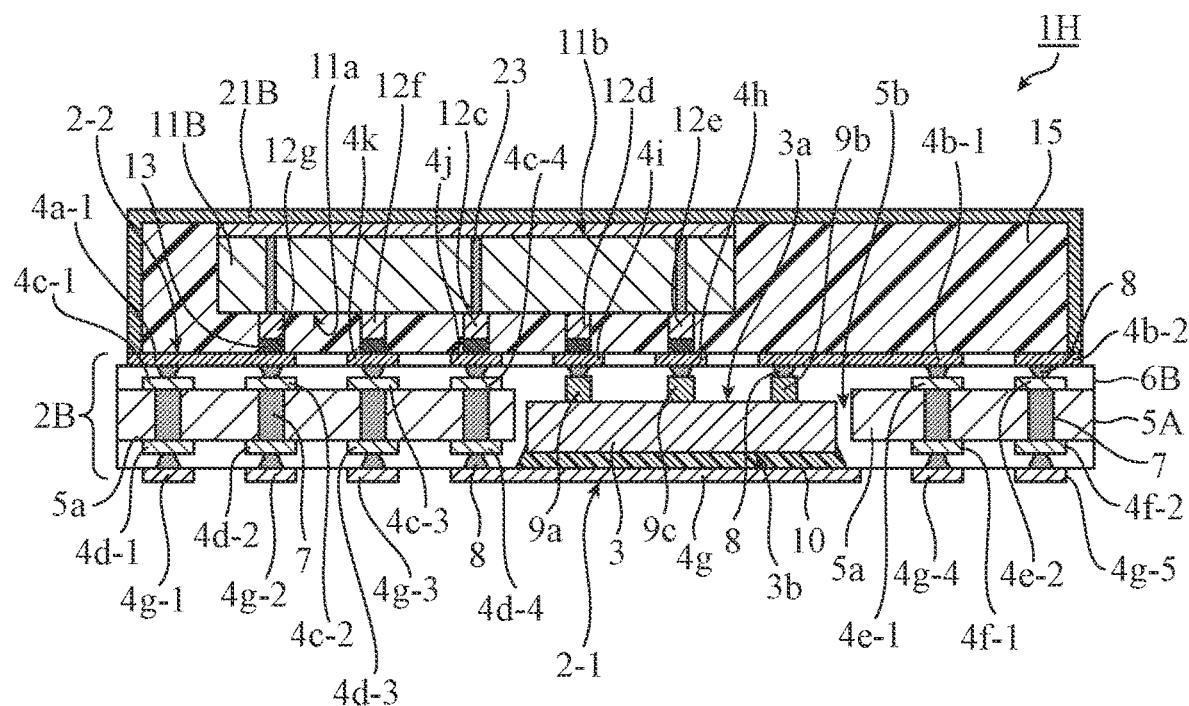
FIG. 14 is a cross-sectional view illustrating structure of a high frequency circuit according to an Embodiment 8 of the present disclosure.

FIG. 14 is a cross-sectional view illustrating structure of a high frequency circuit 1H according to an Embodiment 8 of the present disclosure. In FIG. 14, the same components as those in FIGS. 1, 2, and 4 are denoted by the same reference numerals, and description thereof is omitted. The high frequency circuit 1H includes a printed wiring board 2B, a high frequency device 3, and a high frequency device 11B. A surface 2-2 of the printed wiring board 2B including the high frequency device 11B is molded with resin 15.

The high frequency device 11B embodies a second high frequency device in the present disclosure. As illustrated in FIG. 14, a conductor layer 22 having a ground potential is formed on a mirror surface 11b being a device back surface. A ground terminal on a terminal surface 11a is electrically connected to the conductor layer 22 through a via hole 23 penetrating the high frequency device 11B in a thickness direction.

A shield 21B covers the conductor layer 22 on the mirror surface 11b and a surface of the resin 15 provided around the conductor layer 22 while contacting conductor layers 4a-1 and 4b-2, each having a ground potential.

The shield 21B is formed by, for example, performing metal-plating on the conductor layer 22 of the high frequency device 11B and the surface of the resin 15. Alternatively, a conductive thin film obtained by printing, spraying, or sealing a conductive material on the conductor layer 22 of the high frequency device 11B and the surface of the resin 15 may be used as the shield 21B.

The high frequency circuit 1H operates similarly to the high frequency circuit 1C described in the foregoing Embodiment 3. In this operation, heat generated in the high frequency device 3 is dissipated from a mirror surface 3b to the outside through the adhesive 10 and a conductor layer 4g.

In addition, heat generated in the high frequency device 11B is dissipated from the mirror surface 11b to the outside through the conductor layer 22 and the shield 21B.

Furthermore, when a signal is propagated in the high frequency circuit 1H, the whole of one surface of the high frequency circuit 1H is covered with the shield 21B having a ground potential. Therefore, an unnecessary electromagnetic wave is hardly radiated to the outside of the high frequency circuit 1H.

Figure 15:
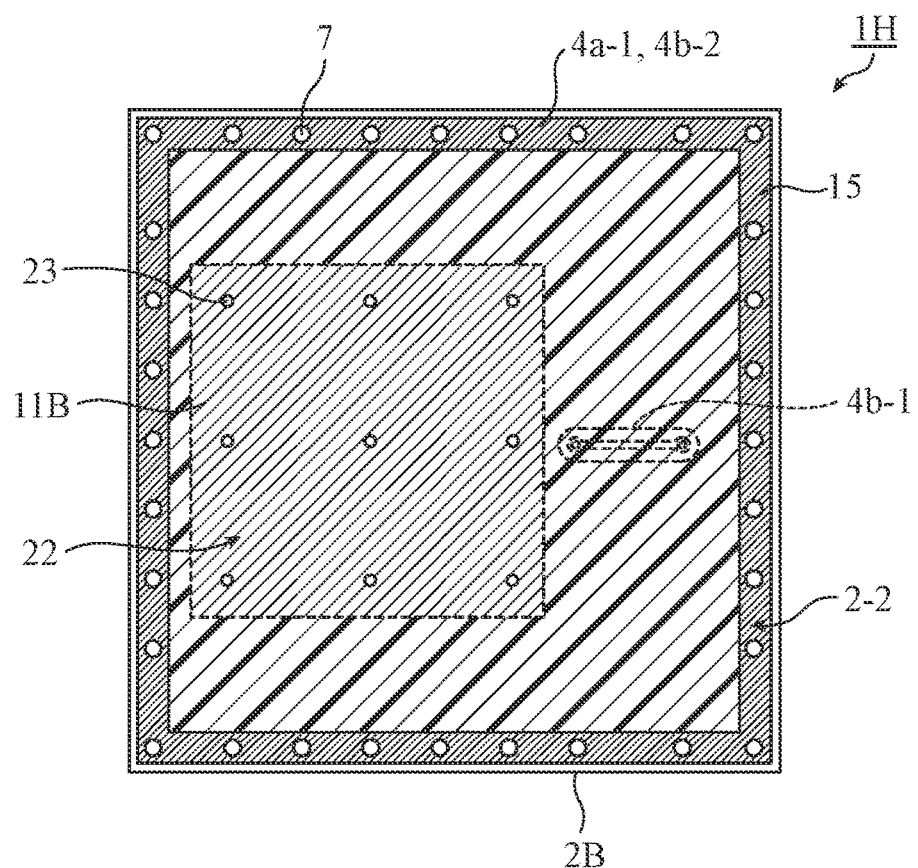
FIG. 15 is a top view illustrating the high frequency circuit according to the Embodiment 8.

FIG. 15 is a top view illustrating the high frequency circuit 1H, in which the high frequency device 11B and a conductor layer 4b-1 covered with the resin 15 are represented by broken lines.

In the high frequency device 11B, as illustrated in FIG. 15, a ground terminal on a terminal surface 11a is electrically connected to the conductor layer 22 through a plurality of via holes 23 provided at a plane perpendicular to a thickness direction.

A space of a ground potential formed by the shield 21B covering the high frequency device 11B is electromagnetically divided into a plurality of small spaces by the via holes 23. In each of the small spaces, a resonance frequency shifts to a higher frequency, and thus oscillation of the high frequency device 11B is suppressed.

In the high frequency circuits 1A and 1B according to the foregoing Embodiment 2, a ground conductor layer may be provided on the mirror surface 11b of the high frequency device 11.

In this case, a ground terminal on the terminal surface 11a of the high frequency device 11 is electrically connected to the above-mentioned conductor layer through a via hole penetrating the high frequency device 11 in a thickness direction.

Even with such structure, an effect similar to the above can be obtained.

In the high frequency circuit 1H, the high frequency device 11B may be fixed by filling an under space thereof with an underfill 14 before being molded with resin 15.

In addition, the high frequency device 11B may be connected to the printed wiring board 2B with an anisotropic conductive adhesive instead of solder 13, and an insulating adhesive may be used as the underfill 14.

Furthermore, the high frequency circuit 1H may be installed on the mother board 16 illustrated in FIGS. 5 and 6.

Although the high frequency device 11B is molded with the resin 15, the Embodiment 8 may be applied to the structure described in the foregoing Embodiment 2.

Specifically, in the high frequency circuits 1A and 1B according to the Embodiment 2, the conductor layer 22 may be formed on the mirror surface 11b of the high frequency device 11, and the shield 21B may be provided on the conductor layer 22 and the resin 15 after the molding may be performed with the resin 15 to expose the conductor layer 22. Even with such structure, an effect similar to the above can be obtained.

Furthermore, on either the terminal surface 3a of the high frequency device 3 or the terminal surface 11a of the high frequency device 11B, ground terminals may be arranged around a signal terminal at intervals designed to reduce leakage of a high frequency signal in a usable frequency band. As a result, it is possible to reduce leakage of an unnecessary high frequency signal to elements other than a signal path passing through a signal terminal.

As described above, in the high frequency circuit 1H according to the Embodiment 8, the conductor layer 22 being a ground conductor layer is formed on the mirror surface 11b of the high frequency device 11B. A ground terminal on the terminal surface 11a is electrically connected to the conductor layer 22 through the via hole 23 penetrating the high frequency device 11B in a thickness direction.

With such structure, a space having a ground potential formed by the shield 21B covering the high frequency device 11B is electromagnetically divided into small spaces by the via hole 23.

Since a resonance frequency shifts to a higher frequency in each of the small spaces, oscillation of the high frequency device 11B can be suppressed.

Embodiment 9

Figure 16:
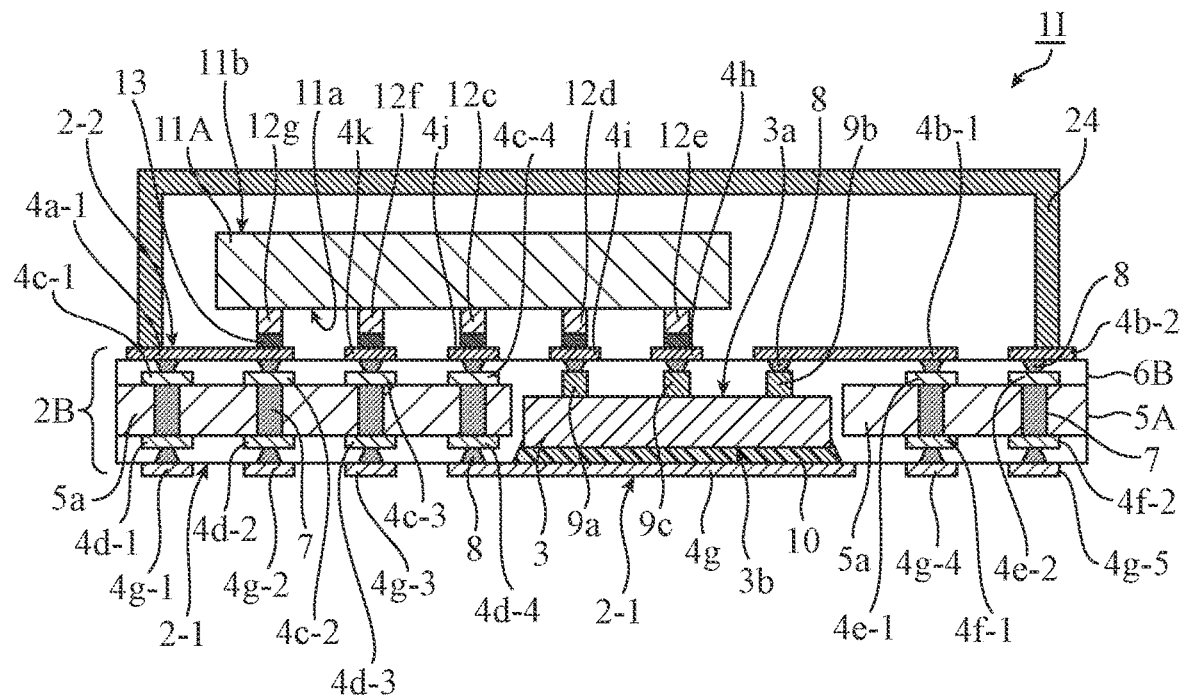
FIG. 16 is a cross-sectional view illustrating structure of a high frequency circuit according to Embodiment 9 of the present disclosure.

FIG. 16 is a cross-sectional view illustrating structure of a high frequency circuit 1I according to Embodiment 9 of the present disclosure. In FIG. 16, the same components as those in FIGS. 1, 2, and 4 are denoted by the same reference numerals, and description thereof is omitted. The high frequency circuit 1I includes a printed wiring board 2B, a high frequency device 3, and a high frequency device 11A. A surface 2-2 of the printed wiring board 2B including the high frequency device 11A is covered with a metal cap 24.

The metal cap 24 is a hollow metal member having an opening. The metal cap 24 is provided such that the opened part thereof faces the surface 2-2 of the printed wiring board 2B.

In addition, the metal cap 24 is in contact with conductor layers 4a-1 and 4b-2 being ground conductors while being disposed on the printed wiring board 2B.

The high frequency circuit 1I operates similarly to the high frequency circuit 1C disclosed in the foregoing Embodiment 3. In this operation, heat generated in the high frequency device 3 is dissipated from a mirror surface 3b to the outside through the adhesive 10 and a conductor layer 4g. In addition, heat generated in the high frequency device 11A is dissipated from a mirror surface 11b to the hollow part covered with the metal cap 24.

Furthermore, when a signal is propagated in the high frequency circuit 1I, the whole of one surface of the high frequency circuit 1I is covered with the metal cap 24 having a ground potential. Therefore, an unnecessary electromagnetic wave is hardly radiated to the outside of the high frequency circuit 1I.

In the high frequency circuit 1I, the high frequency device 11A may be fixed by filling an under space thereof with an underfill 14 before being molded with resin 15.

In addition, the high frequency device 11A may be connected to the printed wiring board 2B with an anisotropic conductive adhesive instead of solder 13, and an insulating adhesive may be used as the underfill 14.

Furthermore, the high frequency circuit 1I may be installed on the mother board 16 illustrated in FIGS. 5 and 6.

Although the high frequency device 11A is molded with the resin 15, the Embodiment 9 may be applied to the structure described in the foregoing Embodiment 2.

Specifically, the metal cap 24 may be provided to each of the high frequency circuits 1A and 1B according to the Embodiment 2. Even with such structure, an effect similar to the above can be obtained.

Furthermore, on either the terminal surface 3a of the high frequency device 3 or the terminal surface 11a of the high frequency device 11A, ground terminals may be arranged around a signal terminal at intervals designed to reduce leakage of a high frequency signal in a usable frequency band.

As a result, it is possible to reduce leakage of an unnecessary high frequency signal to elements other than a signal path passing through a signal terminal.

As described above, the high frequency circuit 1I according to the Embodiment 9 includes the metal cap 24 that covers the surface 2-2 of the printed wiring board 2B and is electrically connected to the conductor layers 4a-1 and 4b-2 being ground conductors. In this way, since a space between the metal cap 24 and a mounting surface of the high frequency device 11A is hollow, a dielectric loss can be reduced.

Embodiment 10

Figure 17:
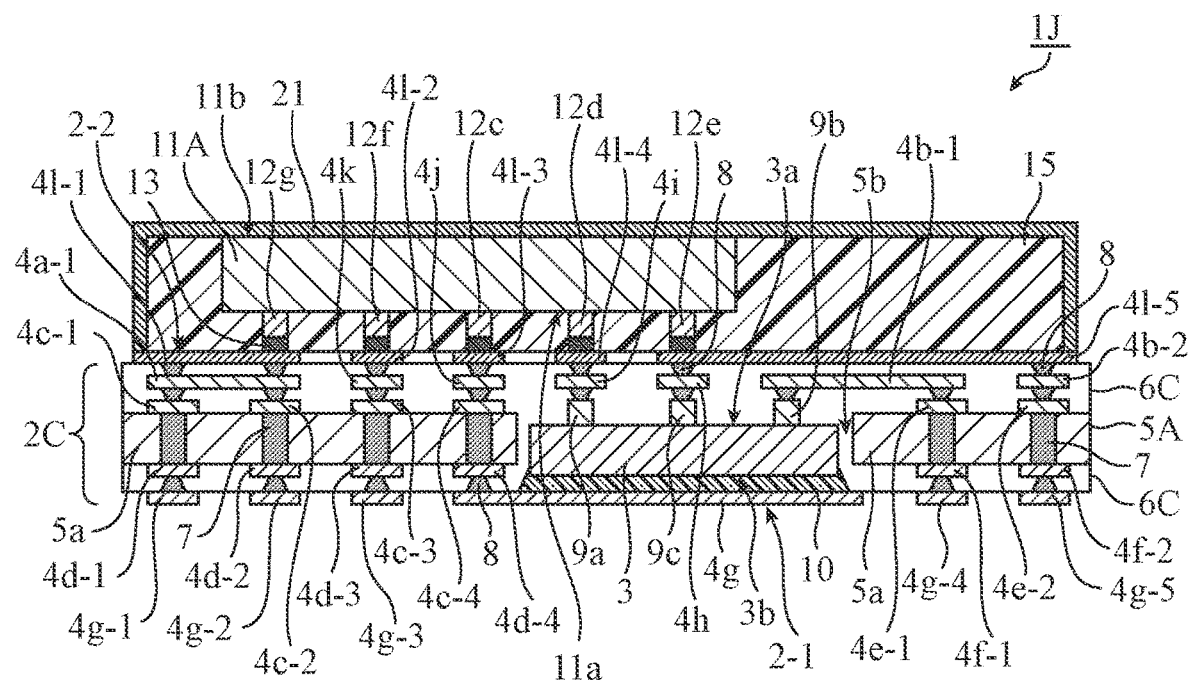
FIG. 17 is a cross-sectional view illustrating structure of a high frequency circuit according to Embodiment 10 of the present disclosure.

FIG. 17 is a cross-sectional view illustrating structure of a high frequency circuit 1J according to Embodiment 10 of the present disclosure. In FIG. 17, the same components as those in FIGS. 1, 2, and 4 are denoted by the same reference numerals, and description thereof is omitted. The high frequency circuit 1J includes a printed wiring board 2C, a high frequency device 3, and a high frequency device 11A. A surface 2-2 of the printed wiring board 2C including the high frequency device 11A is molded with resin 15. In addition, a mirror surface 11b exposed from the resin 15 and a surface of the resin 15 around the mirror surface 11b are covered with a shield 21.

The printed wiring board 2C is a substrate constituting the high frequency circuit 1J according to the Embodiment 10. The printed wiring board 2C includes a core layer 5A and a build-up layer 6C.

Conductor layers 4a-1, 4b-1, 4b-2, 4c-1 to 4c-4, 4d-1 to 4d-4, 4e-1, 4e-2, 4f-1, 4f-2, 4g, 4g-1 to 4g-5, 4h to 4k, and 4l-1 to 4l-5 are formed in the core layer 5A and the build-up layer 6C.

The core layer 5A embodies a first dielectric layer in the present disclosure. The core layer 5A is laminated to sandwich an insulating layer 5a with the conductor layers 4c-1 to 4c-4, 4d-1 to 4d-4, 4e-1, 4e-2, 4f-1, and 4f-2, and has an opening 5b penetrating the core layer 5A in a layer thickness direction.

The build-up layer 6C embodies a second dielectric layer in the present disclosure. Two build-up layers 6C are laminated on an upper surface of the core layer 5A orthogonal to a layer thickness direction, and one build-up layer 6C is laminated on a lower surface of the core layer 5A orthogonal to the layer thickness direction. Note that the build-up layer 6C and a via hole 8 are laminated by, for example, a build-up method.

The conductor layers 4c-1 to 4c-4, 4e-1, and 4e-2 are formed on an upper surface side of the core layer 5A, and the conductor layers 4d-1 to 4d-4, 4f-1, and 4f-2 are formed on a lower surface side of the core layer 5A. The conductor layers 4g and 4g-1 to 4g-5 are formed in the build-up layer 6C on the lower surface side of the core layer 5A.

The conductor layers 4a-1, 4b-1, 4b-2, and 4h to 4k are provided in the first build-up layer 6C from an upper surface of the core layer 5A, and the conductor layers 4l-1 to 4l-5 are provided in the second build-up layer 6C from the upper surface of the core layer 5A.

The conductor layers 4c-1 to 4c-4 are electrically connected to the conductor layers 4d-1 to 4d-4 through a via hole 7 formed in the core layer 5A. The conductor layers 4d-1 to 4d-4 are electrically connected to the conductor layers 4g-1 to 4g-3 and 4g through a via hole 8 formed in the build-up layer 6C.

Similarly, the conductor layers 4e-1 and 4e-2 are electrically connected to the conductor layers 4f-1 and 4f-2 through the via hole 7, and the conductor layers 4f-1 and 4f-2 are electrically connected to the conductor layers 4g-4 and 4g-5 through the via hole 8.

The conductor layers 4c-1 and 4c-2 are electrically connected to the conductor layer 4a-1 through the via hole 8 formed in the first build-up layer 6C from the upper surface of the core layer 5A.

Similarly, the conductor layers 4c-3 and 4c-4 are electrically connected to the conductor layers 4k and 4j through the via hole 8 of the first layer, and the conductor layers 4e-1 and 4e-2 are electrically connected to the conductor layers 4b-1 and 4b-2. The conductor layer 4a-1 is electrically connected to the conductor layer 4l-1 through the via hole 8 formed in the second build-up layer 6C from the upper surface of the core layer 5A.

Through the via holes 8 of the second layer, the conductor layer 4b-2 is electrically connected to the conductor layer 4l-5, the conductor layer 4h is electrically connected to the conductor layer 4l-5, and the conductor layer 4i is electrically connected to the conductor layer 4l-4. Furthermore, through the via holes 8 of the second layer, the conductor layer 4j is electrically connected to the conductor layer 4l-3, and the conductor layer 4k is electrically connected to the conductor layer 4l-2.

The high frequency device 3 is placed within the opening 5b of the core layer 5A with a terminal surface 3a facing upward. The mirror surface 3b of the high frequency device 3 is bonded to the conductor layer 4g with an adhesive 10. Note that the adhesive 10 is desirably an adhesive having high thermal conductivity.

A signal terminal 9a on the terminal surface 3a is electrically connected to the conductor layer 4i being a signal conductor through the via hole 8 of the first layer, and a signal terminal 9b on the terminal surface 3a is electrically connected to the conductor layer 4b-1 being a signal conductor through the via hole 8 of the first layer. A ground terminal 9c on the terminal surface 3a is electrically connected to the conductor layer 4*h* being a ground conductor through the via hole 8 of the first layer.

In the first build-up layer 6C from the upper surface of the core layer 5A, the conductor layers 4*h* and 4*j* being ground conductors are provided around the conductor layer 4*i* being a signal conductor layer, and the conductor layers 4*h* and 4*b*-2 being ground conductors are provided around the conductor layer 4*b*-1 being a signal conductor.

In the second build-up layer 6C from the upper surface of the core layer 5A, the conductor layers 4*l*-3 and 4*l*-5 being ground conductors are provided around the conductor layer 4*l*-4 being a signal conductor.

Furthermore, in the build-up layer 6C laminated on the lower surface of the core layer 5A, the conductor layers 4*g* and 4*g*-5 being ground conductors are provided around the conductor layer 4*g*-4 being a signal conductor.

Next, operation will be described.

A signal input to the conductor layer 4*g*-3 is input to the core layer 5A through the via hole 8 and the conductor layer 4*d*-3, and input to the conductor layer 4*k* in the first build-up layer 6C from the upper surface of the core layer 5A through the via hole 7, the conductor layer 4*c*-3, and the via hole 8.

The above-mentioned signal is input to the conductor layer 4*l*-2 in the second build-up layer 6C from the upper surface of the core layer 5A through the via hole 8, and input to the high frequency device 11A through solder 13 and a signal terminal 12*f*. As a result, the high frequency device 11A processes the signal. Heat generated in the high frequency device 11A during that time is dissipated from the mirror surface 11*b* to the outside through the shield 21.

A signal processed by the high frequency device 11A is input to the conductor layer 4*i* through a signal terminal 12*d*, solder 13, the conductor layer 4*l*-4, and the via hole 8.

Subsequently, the signal is input to the high frequency device 3 through the via hole 8 and the signal terminal 9*a*. As a result, the high frequency device 3 processes the signal.

A signal processed by the high frequency device 3 is input to the core layer 5A through the signal terminal 9*b*, the via hole 8, the conductor layer 4*b*-1, and the via hole 8.

The above-mentioned signal is output from the core layer 5A through the conductor layer 4*e*-1, the via hole 7, and the conductor layer 4*f*-1, and output from the conductor layer 4*g*-4 through the via hole 8. Heat generated in the high frequency device 3 during that time is dissipated from the mirror surface 3*b* to the outside through the adhesive 10 and the conductor layer 4*g*.

When a signal is propagated in the high frequency circuit 1J, one surface of the high frequency circuit 1J is covered with the shield 21 having a ground potential. Therefore, an unnecessary electromagnetic wave is hardly radiated to the outside of the high frequency circuit 1J.

The conductor layer 4*b*-1 being a signal conductor is surrounded by the conductor layers 4*h*, 4*l*-5, 4*b*-2, and 4*e*-2 being ground conductors, and the conductor layer 4*g*-4 being a signal conductor is surrounded by the conductor layers 4*g* and 4*g*-5 being ground conductors. As a result, electromagnetic interference between the high frequency devices in the high frequency circuit 1J and other circuits can be reduced, and oscillation of the high frequency circuit 1J can be suppressed.

In the high frequency circuit 1J, the high frequency device 11A may be fixed by filling an under space thereof with an underfill 14 before being molded with resin 15.

In addition, the high frequency device 11A may be connected to the printed wiring board 2C with an anisotropic conductive adhesive instead of solder 13, and an insulating adhesive may be used as the underfill 14.

The high frequency circuit 1J may be installed on the mother board 16 illustrated in FIGS. 5 and 6.

Furthermore, on either the terminal surface 3*a* of the high frequency device 3 or the terminal surface 11*a* of the high frequency device 11A, ground terminals may be arranged around a signal terminal at intervals designed to reduce leakage of a high frequency signal in a usable frequency band.

As a result, it is possible to reduce leakage of an unnecessary high frequency signal to elements other than a signal path passing through a signal terminal.

Although the two built-up layers 6C laminated on the core layer 5A has been described, three or more build-up layers may be adopted.

In this structure, by providing a ground conductor layer around a conductor layer electrically connected to the signal terminals 9*a* and 9*b* of the high frequency device 3, an effect similar to the above can be obtained.

As described above, in the high frequency circuit 1J according to the Embodiment 10, two build-up layers 6*c* are laminated on the upper surface side of the core layer 5A, and the signal terminals 9*a* and 9*b* of the high frequency device 3 are electrically connected to the conductor layers 4*i*, 4*b*-1, and 4*l*-4. In this structure, the conductor layers 4*j*, 4*h*, and 4*b*-2 being ground conductors are provided around the conductor layers 4*i* and 4*b*-1 being signal conductors, and the conductor layers 4*l*-3 and 4*l*-5 being ground conductors are provided around the conductor layer 4*l*-4 being a signal conductor.

With such structure, electromagnetic interference between the high frequency devices in the high frequency circuit 1J and other circuits can be reduced. Therefore, there is an effect that oscillation of the high frequency circuit 1J can be suppressed in addition to the effect described in the foregoing Embodiment 6.

Embodiment 11

Figure 18:
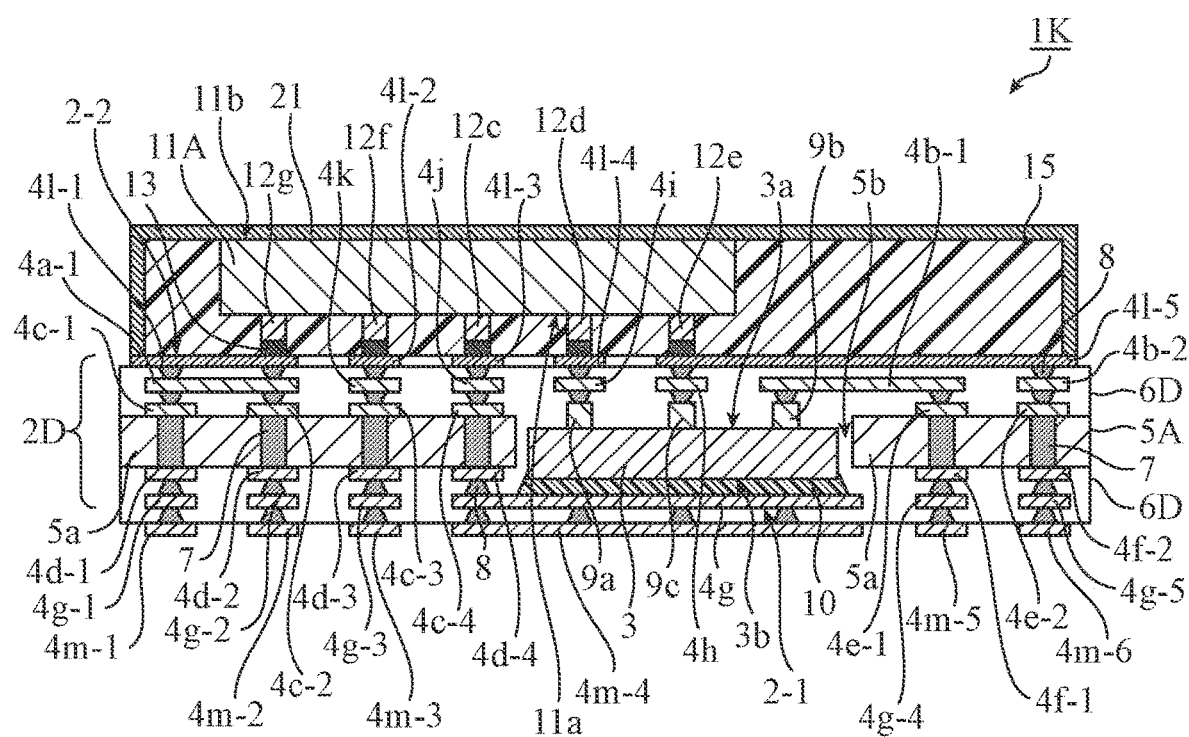
FIG. 18 is a cross-sectional view illustrating structure of a high frequency circuit according to an Embodiment 11 of the present disclosure.

FIG. 18 is a cross-sectional view illustrating structure of a high frequency circuit 1K according to an Embodiment 11 of the present disclosure.

In FIG. 18, the same components as those in FIGS. 1, 2, 4, and 17 are denoted by the same reference numerals, and description thereof is omitted. The high frequency circuit 1K includes a printed wiring board 2D, a high frequency device 3, and a high frequency device 11A. A surface 2-2 of the printed wiring board 2D including the high frequency device 11A is molded with resin 15. In addition, a mirror surface 11*b* exposed from the resin 15 and a surface of the resin 15 around the mirror surface 11*b* are covered with a shield 21.

The printed wiring board 2D is a substrate of the high frequency circuit 1K according to the Embodiment 11, and includes a core layer 5A and a build-up layer 6D.

The printed wiring board 2D includes conductor layers 4*a*-1, 4*b*-1, 4*b*-2, 4*c*-1 to 4*c*-4, 4*d*-1 to 4*d*-4, 4*e*-1, 4*e*-2, 4*f*-1, 4*f*-2, 4*g*, 4*g*-1 to 4*g*-5, 4*h* to 4*k*, 4*l*-1 to 4*l*-5, and 4*m*-1 to 4*m*-6.

The build-up layer 6D embodies a second dielectric layer in the present disclosure. Two build-up layers 6D are laminated on an upper surface of the core layer 5A orthogonal to a layer thickness direction, and another two build-up layers 6D are laminated on a lower surface of the core layer 5A orthogonal to the layer thickness direction. Note that the build-up layer 6C and a via hole 8 are laminated by, for example, a build-up method. Since the build-up layer 6D is laminated on the upper surface of the core layer 5A with the same number of layers as on the lower surface thereof, it is possible to reduce warpage of the printed wiring board 2D due to a vertically symmetrical layer structure.

The conductor layers 4m-1 to 4m-6 are formed in the lowermost build-up layer 6D laminated on a lower surface side of the core layer 5A. The conductor layers 4d-1 to 4d-3 are electrically connected to the conductor layers 4m-1 to 4m-3 through the via hole 8 while interposing the conductor layers 4g-1 to 4g-3 therebetween. The conductor layer 4g is electrically connected to the conductor layer 4m-4 through a plurality of the via holes 8. The conductor layers 4g-4 and 4g-5 are electrically connected to the conductor layers 4m-5 and 4m-6 through the via hole 8.

The conductor layer 4m-4 is a ground conductor layer having one surface facing the outside of the printed wiring board 2D and another surface facing the conductor layer 4g. As described above, the plurality of via holes 8 is formed between the conductor layer 4m-4 and the conductor layer 4g, and the via holes 8 serve as heat dissipation paths.

Specifically, in the high frequency circuit 1K according to the Embodiment 11, the conductor layer 4g and the conductor layer 4m-4 connected to each other through the via hole 8 is a conductor layer for heat dissipation.

The conductor layer 4m-5 is a signal conductor layer. The conductor layers 4m-4 and 4m-6 being ground conductors are provided around the conductor layer 4m-5 as illustrated in FIG. 18.

Next, operation will be described.

A signal input to the conductor layer 4m-3 is input to the core layer 5A through the via hole 8, the conductor layer 4g-3, the via hole 8, and the conductor layer 4d-3, and further input to the conductor layer 4k in the build-up layer 6D through the via hole 7, the conductor layer 4c-3, and the via hole 8.

The above-mentioned signal is input to the conductor layer 4l-2 through the via hole 8, and input to the high frequency device 11A through solder 13 and a signal terminal 12f. The high frequency device 11A processes the signal. Heat generated in the high frequency device 11A during that time is dissipated from the mirror surface 11b to the outside through the shield 21.

A signal processed by the high frequency device 11A is input to the conductor layer 4i through a signal terminal 12d, solder 13, the conductor layer 4l-4, and the via hole 8.

Subsequently, the above-mentioned signal is input to the high frequency device 3 through the via hole 8 and the signal terminal 9a. As a result, the high frequency device 3 processes the signal.

A signal processed by the high frequency device 3 is input to the conductor layer 4b-1 through a signal terminal 9b and the via hole 8 and input to the core layer 5A through the via hole 8.

Thereafter, the signal is output from the core layer 5A through the conductor layer 4e-1, the via hole 7, and the conductor layer 4f-1, and output from the conductor layer 4m-5 through the via hole 8, the conductor layer 4g-4, and the via hole 8. Heat generated in the high frequency device 3 during that time is dissipated from a mirror surface 3b to the outside through an adhesive 10, the conductor layer 4g, the via hole 8, and the conductor layer 4m-4.

Furthermore, when a signal is propagated in the high frequency circuit 1K, the whole of one surface of the high frequency circuit 1K is covered with the shield 21 having a ground potential. Therefore, an unnecessary electromagnetic wave is hardly radiated to the outside of the high frequency circuit 1K.

In addition, the conductor layer 4b-1 being a signal conductor is surrounded by the conductor layers 4h, 4l-5, 4b-2, and 4e-2 being ground conductors. The conductor layer 4g-4 being a signal conductor is surrounded by the conductor layers 4g and 4g-5 being ground conductors, and the conductor layer 4m-5 being a signal conductor is surrounded by the conductor layers 4m-4 and 4m-6 being ground conductors. As a result, electromagnetic interference between the high frequency devices in the high frequency circuit 1K and other circuits can be reduced, and oscillation of the high frequency circuit 1K can be suppressed.

In the high frequency circuit 1K, the high frequency device 11A may be fixed by filling an under space thereof with an underfill 14 before being molded with resin 15.

In addition, the high frequency device 11A may be connected to the printed wiring board 2D with an anisotropic conductive adhesive instead of solder 13, and an insulating adhesive may be used as the underfill 14.

The high frequency circuit 1K may be installed on the mother board 16 illustrated in FIGS. 5 and 6.

Furthermore, on either the terminal surface 3a of the high frequency device 3 or the terminal surface 11a of the high frequency device 11A, ground terminals may be arranged around a signal terminal at intervals designed to reduce leakage of a high frequency signal in a usable frequency band. As a result, it is possible to reduce leakage of an unnecessary high frequency signal to elements other than a signal path passing through a signal terminal.

In the above description, two built-up layers 6D are laminated on each of the upper and lower surfaces of the core layer 5A. Alternatively, three or more build-up layers may be laminated.

That is, in the high frequency circuit 1K according to the Embodiment 11, it is only required to laminate the build-up layer 6D on the upper surface of the core layer 5A with the same number of layers as on the lower surface thereof.

In such structure, by providing a ground conductor layer around a conductor layer electrically connected to the signal terminals 9a and 9b of the high frequency device 3, an effect similar to the above can be obtained.

As described above, in the high frequency circuit 1K according to the Embodiment 11, the build-up layer 6D is laminated on the upper surface of the core layer 5A with the same number of layers as on the lower surface thereof.

With such structure, it is possible to reduce warpage of the printed wiring board 2D due to a vertically symmetrical layer structure.

In the present disclosure, the embodiments can be freely combined with one another, any component in the embodiments can be modified, or any component in the embodiments can be omitted within the scope of the invention.

The high frequency circuit according to the present disclosure has a small size, can reduce a loss of input and output signals, and can realize high heat dissipation characteristics. Therefore, it is suitable for, for example, a high frequency circuit used for a transmission/reception unit of communication equipment.

REFERENCE SIGNS LIST

1/1A-1K: High frequency circuit, 2/2A-2D: Printed wiring board, 2-1/2-2: Surface, 3/11/11A/11B: High frequency device, 3a/11a: Terminal surface, 3b/11b: Mirror surface, 4a/4a-1/4b/4b-1/4b-2/4c/4c-1-4c-4/4d/4d-1-4d-4/4e/4e-1/4e-2/4f/4f-1/4f-2/4g/4g-1-4g-5/4h-4k/4l-1-4l-5/4m-1-4m-6, 22: Conductor layer, 5/5A: Core layer, 5a: Insulating layer, 5b: Opening, 6, 6A-6D: Build-up layer, 7/8/18/23: Via hole, 9a/9b/12a/12d/12f: Signal terminal, 9c/12b/12c/12e/12g: Ground terminal, 10/10a: Adhesive, 13: Solder, 14: Underfill, 16: Mother board, 17a-17e: Conductor layer, 19: Metal block, 20: Metal plate, 21/21A/21B: Shield, 24: Metal cap

The invention claimed is:

1. A high frequency circuit comprising: a substrate that includes a first dielectric layer having an opening which penetrates the first dielectric layer in a layer thickness direction, second dielectric layers laminated on a lower surface and an upper surface of the first dielectric layer, and a plurality of conductor layers provided in the first dielectric layer and at least one of the second dielectric layers; a first high frequency device that is placed within the opening, the first high frequency device being installed such that a device back surface opposite a terminal surface is thermally and closely connected to a conductor layer for heat dissipation out of the plurality of conductor layers, the conductor layer for heat dissipation provided at a lower surface side of the first dielectric layer, and terminals on the terminal surface are electrically connected to terminal conductor layers out of the plurality of conductor layers through a first via hole provided in the at least one of the second dielectric layers, the terminal conductor layers being formed on an upper surface side of the first dielectric layer; and a second high frequency device that is installed such that a terminal surface thereof faces a surface layer of the upper surface side of the first dielectric layer in the substrate and that the terminals on the terminal surface are electrically connected to the terminal conductor layers, wherein the first and second high frequency devices are disposed at different positions in a planar direction on the substrate, and wherein signal terminals of the first and second high frequency devices are separated by a ground terminal.

2. The high frequency circuit according to claim 1, wherein the second high frequency device is molded with resin.

3. The high frequency circuit according to claim 2, wherein the second high frequency device includes a device back surface installed opposite a terminal surface and exposed from the resin.

4. The high frequency circuit according to claim 2, wherein the second high frequency device includes a device back surface;
the circuit further comprising a metal plate thermally connected to the device back surface opposite the terminal surface of the second high frequency device, wherein the metal plate is exposed from the resin.

5. The high frequency circuit according to claim 3, further comprising a first shield that covers the device back surface of the second high frequency device and the resin, and that is electrically connected to a conductor layer having a ground potential.

6. The high frequency circuit according to claim 1, wherein the terminal surface of the first high frequency device and the terminal surface of the second high frequency device have ground terminals arranged around a signal terminal at intervals that are designed to reduce leakage of a high frequency signal in a usable frequency band.

7. The high frequency circuit according to claim 4, further comprising a second shield that covers the resin and the metal plate exposed from the resin and that is electrically connected to a conductor layer having a ground potential.

8. The high frequency circuit according to claim 1, wherein the second high frequency device has a device back surface and is installed such that
a conductor layer having a ground potential is provided on the device back surface opposite the terminal surface, and
a ground terminal on the terminal surface is electrically connected through a second via hole to the conductor layer formed on the device back surface, the second via hole penetrating the second high frequency device in a thickness direction.

9. The high frequency circuitry according to claim 1, further comprising a metal cap that covers a surface of the substrate, on which the second high frequency device is installed, and that is electrically connected to a conductor layer having a ground potential and being formed on the substrate.

10. The high frequency circuit according to claim 1, wherein the first dielectric layer has an upper surface side; the second dielectric layers are laminated with two or more dielectric layers onto the upper surface side of the first dielectric layer, at least one of the signal terminals of the first high frequency device is electrically connected to the conductor layers for propagating a signal in the at least one of the second dielectric layers, and the conductor layers are surrounded by a ground potential provided around the conductor layers for signal propagation.

11. The high frequency circuit according to claim 10, wherein the at least one of the second dielectric layers is laminated on the lower surface of the first dielectric layer with a same number of layers as on the upper surface thereof.

* * * * *